(12) United States Patent (10) Patent No.: US 11,410,711 B2
Zhu (45) Date of Patent: Aug. 9, 2022

(54) DATA WRITING METHOD AND APPARATUS

(71) Applicant: TIRO INNOVATION TECHNOLOGY (SHENZHEN) CO., LTD., Guangdong (CN)

(72) Inventor: Weixing Zhu, Guangdong (CN)

(73) Assignee: TIRO INNOVATION TECHNOLOGY (SHENZHEN) CO., LTD., Shenzhen (CN)

( * ) Notice: Subject to any disclaimer, the term of this patent is extended or adjusted under 35 U.S.C. 154(b) by 861 days.

(21) Appl. No.: 16/322,588

(22) PCT Filed: Dec. 3, 2018

(86) PCT No.: PCT/CN2018/118930
§ 371 (c)(1),
(2) Date: Feb. 1, 2019

(87) PCT Pub. No.: WO2019/205637
PCT Pub. Date: Oct. 31, 2019

(65) Prior Publication Data
US 2021/0375335 A1 Dec. 2, 2021

(30) Foreign Application Priority Data

Apr. 24, 2018 (CN) .......................... 201810373882.4
Apr. 24, 2018 (WO) ................ PCT/CN2018/084246
Oct. 29, 2018 (CN) .......................... 201811271213.2

(51) Int. Cl.
*G11C 7/10* (2006.01)
*G06F 8/61* (2018.01)
(Continued)

(52) U.S. Cl.
CPC .............. *G11C 7/1045* (2013.01); *G06F 8/61* (2013.01); *G11C 5/14* (2013.01); *G11C 7/1069* (2013.01);
(Continued)

(58) Field of Classification Search
CPC ..... G11C 16/10; G11C 16/30; G11C 16/3404; G11C 5/14; G11C 7/1045; G11C 7/1069;
(Continued)

(56) References Cited

U.S. PATENT DOCUMENTS 5,687,345 A * 11/1997 Matsubara ......... G11C 16/3427
365/185.24
7,362,610 B1 * 4/2008 Salter, III ........... G11C 16/3418
365/185.24
2012/0002485 A1 * 1/2012 Suwa ..................... G11C 16/10
365/185.29

FOREIGN PATENT DOCUMENTS

CN 101661795 3/2010
CN 102298912 12/2011
(Continued)

OTHER PUBLICATIONS

International Search Report filed in PCT/CN2018/084246 dated Jul. 25, 2018.

*Primary Examiner* — Terrell S Johnson
(74) *Attorney, Agent, or Firm* — Rankin, Hill & Clark LLP

(57) ABSTRACT

The present application is applicable to the field of integrated circuit technology, and provides a data writing method, system, apparatus, device and medium for an integrated circuit chip. The data writing method is applied to a writer, the integrated circuit chip is electrically connected with the writer through a power-supply positive terminal and a power-supply negative terminal, and the data writing method includes: sending a data writing order to the integrated circuit chip, where the data writing order is configured to instruct the integrated circuit chip to enter a data writing mode after receiving the data writing order; and performing data writing to the integrated circuit chip by controlling an electrical parameter of an input voltage of the
(Continued)

power-supply positive terminal or the power-supply negative terminal of the integrated circuit chip after the integrated circuit chip enters the data writing mode.

13 Claims, 5 Drawing Sheets

(51) Int. Cl.
*G11C 5/14* (2006.01)
*G06F 13/42* (2006.01)
*G11C 7/22* (2006.01)
*G11C 16/10* (2006.01)
*G11C 16/30* (2006.01)
*G11C 16/34* (2006.01)

(52) U.S. Cl.
CPC ........ *G11C 7/1096* (2013.01); *G06F 13/4234* (2013.01); *G11C 7/22* (2013.01); *G11C 16/10* (2013.01); *G11C 16/30* (2013.01); *G11C 16/3404* (2013.01)

(58) Field of Classification Search
CPC ..... G11C 7/1096; G11C 7/22; G06F 13/4234; G06F 8/61
See application file for complete search history.

(56) References Cited

FOREIGN PATENT DOCUMENTS

| | | |
|---|---|---|
| CN | 202150274 | 2/2012 |
| CN | 103531236 | 1/2014 |
| CN | 104598408 | 5/2015 |
| CN | 105573743 | 5/2016 |
| CN | 107391212 | 11/2017 |
| CN | 108363581 | 8/2018 |
| JP | 6255236 | 11/1987 |
| JP | 2007116625 | 5/2007 |

* cited by examiner

DATA WRITING METHOD AND APPARATUS

This application is the International Application No. PCT/CN2018/118930 for entry into US national phase with an international filing date of Dec. 3, 2018 designating US, now pending, and claims priority to Chinese Patent Application No. 201810373882.4, entitled "Data writing Method, System, Apparatus, Device and Medium for Integrated Circuit Chip", filed with the Chinese Patent Office on Apr. 24, 2018, to International Application No. PCT/CN2018/084246, entitled "Data writing Method, System, Apparatus, Device and Medium for Integrated Circuit Chip", filed with the World Intellectual Property Organization on Apr. 24, 2018, and to Chinese Patent Application No. 201811271213.2, entitled "Data writing Method, System, Apparatus, Device and Medium for Integrated Circuit Chip", filed with the Chinese Patent Office on Oct. 29, 2018, which are incorporated herein by reference in their entirety.

TECHNICAL FIELD

The present disclosure relates to the field of integrated circuit technology, and in particular to a data writing method, system, apparatus, device and medium for integrated circuit chip.

BACKGROUND

With the rapid development of semiconductor technology, more and more programmable integrated circuit chips are used in circuit boards. Electrically Erasable Programmable Read Only Memory (EEPROM), Flash, and Programmable Logic Device (PLD) are favored in the electronics industry due to their programmable functions.

However, data writing for current programmable integrated circuit chips generally requires to be performed through a specific interface which may be a Joint Test Action Group (JTAG) interface, an in-circuit programmer (ICP) interface, an In-System Programming (ISP) interface or an Universal Asynchronous Receiver/Transmitter (UART) interface, and at least 4 wires are required to complete data writing through these specific interfaces, and it also needs to be done before the programmable integrated circuit chip is bound or patched to the Printed Circuit Board Assembly (PCBA). It can be seen that this traditional data writing method is very inflexible and will cause the corresponding finished products production mode to be fixed and a long cycle, so that the production efficiency of the finished products lags far behind the growth rate of the current demand of the industry.

SUMMARY

Technical Problem

According to embodiments of the present disclosure, it is provided a data writing method, system, apparatus, device and medium for an integrated circuit chip, aiming to solve the problem that the data writing method for the integrated circuit chip in the prior art is inflexible and the production efficiency of the finished products is low.

Technical Solutions

According to the first aspect of the present disclosure, it is provided a data writing method for an integrated circuit chip, which is applicable to a writer, where the integrated circuit chip is electrically connected with the writer through a power-supply positive terminal and a power-supply negative terminal, the integrated circuit chip is provided with a built-in or an external memory, the data writing means that the memory built-in or external to the integrated circuit chip is written data by the writer, and the data writing method includes:

sending a data writing order to the integrated circuit chip, where the data writing order is configured to instruct the integrated circuit chip to enter a data writing mode upon receiving the data writing order; and performing data writing to the integrated circuit chip by controlling an electrical parameter of an input voltage of the power-supply positive terminal or the power-supply negative terminal of the integrated circuit chip when the integrated circuit chip is in the data writing mode.

According to the second aspect of the present disclosure, it is provided a data writing method for an integrated circuit chip, where the integrated circuit chip is connected with a writer through a power-supply positive terminal and a power-supply negative terminal, and the data writing method includes:

receiving, by the integrated circuit chip, a data writing order sent from the writer and entering a data writing mode;

determining, by the integrated circuit chip, data transmitted from the writer by detecting an electrical parameter of an input voltage of the power-supply positive terminal or the power-supply negative terminal controlled by the writer; and enabling, by the integrated circuit chip, the data transmitted from the writer.

According to the third aspect of the present disclosure, it is provided a data writing system for an integrated circuit chip, where the data writing system includes a writer and an integrated circuit chip, the writer includes a controller and a first signal conversion circuit, the controller is electrically connected with a power-supply positive terminal and a power-supply negative terminal of the integrated circuit chip by the first signal conversion circuit;

where the controller is configured to send a data writing order to the integrated circuit chip, where the data writing order is configured to instruct the integrated circuit chip to enter a data writing mode after receiving the data writing order; and perform data writing to the integrated circuit chip by controlling, by the first signal conversion circuit, an electrical parameter of an input voltage of the power-supply positive terminal or the power-supply negative terminal of the integrated circuit chip after the integrated circuit chip enters the data writing mode.

According to the fourth aspect of the present disclosure, it is provided a data writing apparatus for an integrated circuit chip, configured in a writer, where the integrated circuit chip is electrically connected with the writer through a power-supply positive terminal and a power-supply negative terminal, the data writing apparatus includes:

a sending unit configured to send a data writing order to the integrated circuit chip, where the data writing order is configured to instruct the integrated circuit chip to enter a data writing mode after receiving the data writing order; and a control execution unit configured to perform data writing to the integrated circuit chip by controlling an electrical parameter of an input voltage of the power-supply positive terminal or the power-supply negative terminal of the integrated circuit chip after the integrated circuit chip enters the data writing mode.

According to the fifth aspect of the present disclosure, it is provided a data writing apparatus for an integrated circuit chip, configured in an integrated circuit chip, where the integrated circuit chip is configured to be electrically connected with a writer through a power-supply positive terminal and a power-supply negative terminal, the data writing apparatus includes:

a receiving unit configured to receive a data writing order sent from the writer and enter a data writing mode;

a detection execution unit configured to determine data transmitted from the writer by detecting an electrical parameter of an input voltage of the power-supply positive terminal or the power-supply negative terminal controlled by the writer; and an enabling unit for enabling the data transmitted from the writer.

According to the sixth aspect of the present disclosure, it is provided a data writing device for an integrated circuit chip, comprising a memory, a processor, and computer readable instructions stored in the memory and operable in the processor, where the processor is configured to execute the computer readable instructions to implement steps of the method according to the first aspect or the second aspect.

According to the seventh aspect of the present disclosure, it is provided a computer readable storage medium having computer readable instructions stored therein, where when the computer readable instructions are executed by a processer; steps of the method according to the first aspect or the second aspect are implemented.

Beneficial Effect

In an embodiment of the present disclosure, the power-supply positive terminal and the power-supply negative terminal of the integrated circuit chip are electrically connected with the writer, the writer sends a data writing order to the integrated circuit chip, and data writing to the integrated circuit chip is performed by controlling the electrical parameter of the input voltage of the power-supply positive terminal or the power-supply negative terminal of the integrated circuit chip after the integrated circuit chip enters the data writing mode, thus the technical problem that the data writing method for the integrated circuit chip in the prior art is inflexible and the production efficiency of the finished products is low can be solved.

BRIEF DESCRIPTION OF THE DRAWINGS

In order to more clearly illustrate the technical solutions in the embodiments of the present disclosure, the drawings used in the description to the embodiments or the prior art will be briefly described below. It is obvious that the drawings in the following description are just for some embodiments of the present disclosure, those skilled in the art can also obtain other drawings based on these drawings without paying any creative effort.

DESCRIPTION OF THE EMBODIMENTS

In the following description, in order to describe but not intended to limit, concrete details such as specific system structure, technique, and so on are proposed, thereby facilitating comprehensive understanding of the embodiments of the present application. However, it will be apparent to the ordinarily skilled one in the art that, the present application can also be implemented in some other embodiments without these concrete details. In some other conditions, detailed explanations of method, circuit, device and system well known to the public are omitted, so that unnecessary details can be prevented from obstructing the description of the present application.

In order to explain the technical solutions described in the present disclosure, the following description will be made by way of specific embodiments.

Embodiment 1

Figure 1:
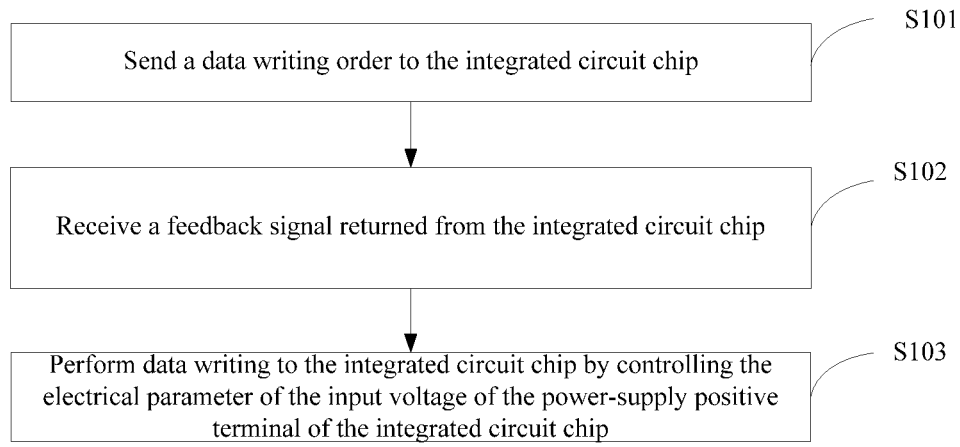
FIG. 1 is a schematic flowchart of an implementation process of a data writing method for an integrated circuit chip according to an embodiment of the present disclosure.

FIG. 1 is a schematic flowchart of an implementation process of a data writing method for an integrated circuit chip according to an embodiment of the present disclosure. The data writing method is suitable for the case of performing data writing to the integrated circuit chip, is applied to the writer, and can be implemented by software and/or hardware.

As shown in FIG. 1, the data writing method includes the steps of S101 to S103.

In S101, a data writing order is sent to the integrated circuit chip, where the data writing order is configured to instruct the integrated circuit chip to enter a data writing mode after receiving the data writing order and to return a feedback signal.

The integrated circuit chip refers to an integrated circuit that can be independently used after being designed, manufactured, packaged and tested, and has a data processing function and a built-in or an external memory. The data writing means that the memory built-in or external to the integrated circuit chip is written data by the writer, that is, the information stored in the memory that built-in or external to the integrated circuit chip can be updated through the writer transmits data. The integrated circuit chip may be a Microcontroller Unit (MCU), a Central Processing Unit (CPU), a Digital Signal Processor (DSP) or a PLD. The memory may be an EEPROM, a Flash or the like.

The writer is a tool capable of writing data to the integrated circuit chip, and is mainly used for programming for chips such as single-chip microcomputers/memories.

In an embodiment of the present disclosure, the integrated circuit chip is electrically connected with the writer directly through its own power-supply positive terminal and power-supply negative terminal. Specifically, the integrated circuit chip is electrically connected with the writer through 2 input lines of the power-supply positive terminal and the power-supply negative terminal, and the writer is externally connected with a power source so that a circuit loop is formed.

Figure 2:
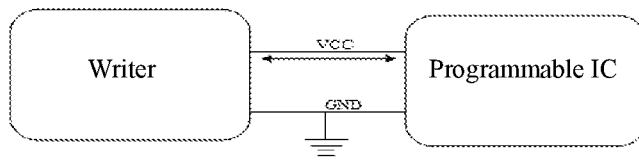
FIG. 2 is a schematic diagram of a data writing system for an integrated circuit chip according to an embodiment of the present disclosure.

The power-supply positive terminal may be a power positive terminal VCC (Volt Current Condenser) or a power positive terminal VDD (Voltage Drain Drain), and may be selected or determined according to specific integrated circuit chips. The power-supply negative terminal may be a power negative terminal VSS, or may be a ground (GND), and may be selected or determined according to specific integrated circuit chips. Since the integrated circuit chip is typically powered by a single power supply, the power-supply negative terminal is grounded. In order to explain the present disclosure more clearly, in the description of the following specific embodiments, the manner that the integrated circuit chip is electrically connected with the writer through its own power-supply positive terminal and power-supply negative terminal and the writer performs the data writing to the integrated circuit chip by controlling the electrical parameter of the input voltage of the power-supply positive terminal of the integrated circuit chip will be described as an example. As shown in FIG. 2, the power-supply positive terminal is the power positive terminal VCC and the power-supply negative terminal is GND.

Figure 3:
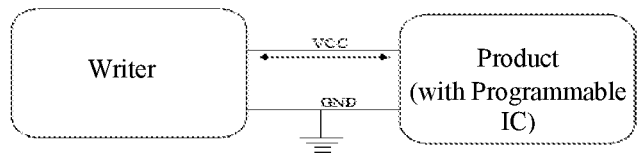
FIG. 3 is a schematic diagram of another data writing system of an integrated circuit chip according to an embodiment of the present disclosure.

It should be noted that after the integrated circuit chip being packaged to become a product, a battery holder for powering the product is generally provided, and the battery holder is connected with the 2 input lines of the power-supply positive terminal and the power-supply negative terminal of the integrated circuit chip. Thus the battery on the battery holder can be isolated for power supply, or the power-supply battery may be taken out from the battery holder and the integrated circuit chip is electrically connected with the writer directly through the contact of the power positive terminal and the contact of the power negative terminal on the battery holder, as shown in FIG. 3. And the writer is externally connected with a power source to form a circuit loop.

The writer sends a data writing order to the integrated circuit chip. The data writing order is configured to instruct the integrated circuit chip to enter the data writing mode and return a feedback signal after receiving the data writing order.

The data writing mode refers to a preparation state that the integrated circuit chip responds to the writer to perform the data writing. The data writing order is used to instruct the integrated circuit chip to enter the data writing mode and to return a feedback signal after receiving the data writing order. The expression that the integrated circuit chip returns a feedback signal means that the integrated circuit chip feeds back a signal indicating that the data writing mode has been entered to the writer.

As an embodiment of the present disclosure, the writer includes a controller configured to send orders to the integrated circuit chip. After receiving the order sent from the writer, the integrated circuit chip detects and determines the sent order by the built-in or external second signal conversion circuit. If the sent order is a data writing order, the integrated circuit chip enters the data writing mode and sends a feedback signal to the writer. In other embodiments of the present disclosure, the integrated circuit chip is further connected with an LED and/or a speaker. After the integrated circuit chip successfully enters the data writing mode, the LED electrically connected with the integrated circuit chip is controlled to flash and/or the speaker generates a sound to prompt that the integrated circuit chip successfully enters the data writing mode. With this configuration, engineers who monitor the data writing can more quickly and intuitively determine that the integrated circuit chip has successfully entered the data writing mode, facilitating the engineers to monitor the entire process and further improving efficiency.

In S102, a feedback signal returned from the integrated circuit chip is received.

The feedback signal returned by the integrated circuit chip refers to a signal indicating that the data writing mode has been entered, which is fed back from the integrated circuit chip to the writer. After receiving the feedback signal returned by the integrated circuit chip, the writer performs data writing to the integrated circuit chip by controlling the electrical parameter of the input voltage of the power-supply positive terminal of the integrated circuit chip.

In S103, data writing is performed to the integrated circuit chip by controlling the electrical parameter of the input voltage of the power-supply positive terminal of the integrated circuit chip.

The data writing refers to that the writer transmits data that needs to be written into the integrated circuit chip to the integrated circuit chip, thereby updating information in the built-in or external memory of the integrated circuit chip.

Controlling the electrical parameter of the input voltage of the power-supply positive terminal of the integrated circuit chip may be controlling the magnitude of the input voltage, such as a square wave voltage, of the power-supply positive terminal of the integrated circuit chip or may be controlling the frequency of an electrical signal superimposed on the input voltage of the power-supply positive terminal of the integrated circuit chip, for example, controlling the frequency of the sinusoidal signal superimposed on the input voltage of the power-supply positive terminal of the integrated circuit chip, for another example, controlling the frequency of the triangular wave, the sawtooth wave or the like, which are superimposed on the input voltage of the power-supply positive terminal of the integrated circuit chip. It should be noted that the description herein is merely exemplary and should not be construed as limiting the disclosure.

In the embodiment of the present disclosure, the writer includes a first signal conversion circuit, and the writer performs the data writing to the integrated circuit chip by controlling the electrical parameter of the input voltage of the power-supply positive terminal of the integrated circuit chip by its built-in first signal conversion circuit.

As an embodiment of the present disclosure, the writer performing the data writing to the integrated circuit chip by controlling the magnitude of the input voltage of the power-supply positive terminal of the integrated circuit chip refers to that the writer changes the magnitude of the input voltage of the input voltage of the power-supply positive terminal of the integrated circuit chip by its built-in first signal conversion circuit to transmit binary data "0" and "1".

Figure 4:
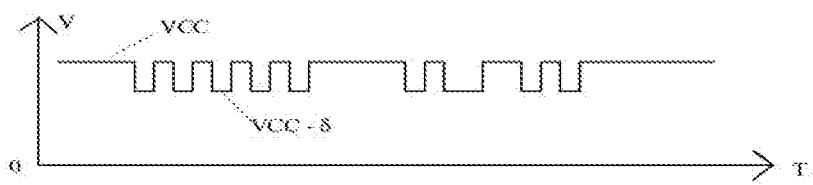
FIG. 4 is a schematic diagram of controlling a magnitude of an input voltage in a data writing method for an integrated circuit chip according to an embodiment of the present disclosure.

Among them, magnitudes of different input voltages may be selected from the range [VCC-δ, VCC]. VCC refers to the input voltage of the power-supply positive terminal VCC of the integrated circuit chip, usually being 1.8V, 3V, or 5V. The value range of δ is (0, VCC]. In addition, different number of value of input voltage may be selected from [VCC-δ, VCC], for example, 2, 8 or 16, etc., may be selected. The larger the number of the value of input voltage is, the higher the transmission efficiency of the transmitted data is, thereby further improving the efficiency of data writing. For example, as shown in FIG. 4, two values of input voltage VCC-δ and VCC are selected for transmitting binary data "0" and "1" respectively.

As another embodiment of the present disclosure, the writer performing the data writing to the integrated circuit chip by controlling the frequency of the sinusoidal signal superimposed on the input voltage of the power-supply positive terminal of the integrated circuit chip refers to that the writer changes the frequency of the sinusoidal signal superimposed on the input voltage of the power-supply positive terminal of the integrated circuit chip by its built-in first signal conversion circuit to transmit binary data "0" and "1".

Figure 5:
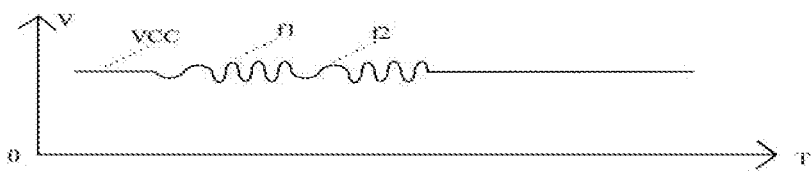
FIG. 5 is a schematic diagram of a controlling a frequency of an electrical signal superimposed on an input voltage in a data writing method for an integrated circuit chip according to an embodiment of the present disclosure.

In addition, various numbers of different frequencies of the sinusoidal signal that superimposed on the input voltage may be selected, for example, at least 2, 3 or more may be selected. By selecting the different frequencies of the sinusoidal signal with larger number, the transmission efficiency of the transmitted data can be made higher, thereby further improving the efficiency of data writing. For example, as shown in FIG. 5, by controlling the frequency of the sinusoidal signal superimposed on the input voltage of the power-supply positive terminal of the integrated circuit chip to be switched between f1 and f2, the binary data "0" and "1" can be transmitted.

The existing writers perform data writing to a memory integrated in or external to the integrated circuit chip through a specific interface of the integrated circuit chip, such as a JTAG interface, which at least use four lines. In the technical solution provided by the present disclosure, only 2 input lines of the power-supply positive terminal and the power-supply negative terminal of the integrated circuit chip is required to complete the data writing, which is simpler and more convenient. In addition, since the data writing in the present disclosure no longer depends on a specific interface such as JTAG, the cost of manufacturers binding chip is subtly reduced.

It should be noted that, in an embodiment of the present disclosure, the integrated circuit chip enters the data writing mode and returns a feedback signal to enable the writer to perform data writing to the integrated circuit chip. However, those skilled in the art know that the integrated circuit chip will enter the data writing mode after receiving the data writing order, regardless of what kind of feedback signal is used by the integrated circuit chip to indicate that it successfully enters the data writing mode, or regardless of whether a feedback signal indicating the data writing mode has been successfully entered is returned or not, so that the writer can perform data writing to the integrated circuit chip. The manner in which the integrated circuit chip returns the feedback signal in this embodiment is merely an exemplary description and cannot be construed as a specific limitation on the present disclosure.

In the prior art, data writing for the built-in or external memory of the integrated circuit chip needs to be completed before the integrated circuit chip is packaged into a finished product, which results in an overlong production cycle of the finished product and cannot match the current rapidly growing demand for the finished product. With the technical solution provided in the present disclosure, the order of data writing may be the same as that of the traditional mode. When there is actual demand, the data writing may be performed before the integrated circuit chip with data being written is made into a finished product, or the integrated circuit chip without data being written may be made into a semi-finished product before the semi-finished products are uniformly performed with data writing according to the specific functional requirements. It can be seen that compared with the conventional mode, the technical solution according to the present disclosure is very clever and greatly shortens the period from determining the product demand to the production of the required product, and is more flexible and controllable.

In addition, in the prior art, the assembled electronic product generally cannot be performed with data writing to complete the function replacement, or requires extremely cumbersome disassembly to enable data writing so as to complete the function replacement. In a technical solution according to the present disclosure, for the assembled electronic products, the data writing can be performed by the contact of the power positive terminal and the contact of the power negative terminal on the battery holder that correspondingly electrically connected to the inputs of the power-supply positive terminal and the power-supply negative terminal of the built-in integrated circuit chip of the product, thereby realizing functional update of the assembled electronic products. Since these contacts are externally visible, cumbersome disassembly is not required and it is easy and flexible to implement.

Embodiment 2

Figure 6:
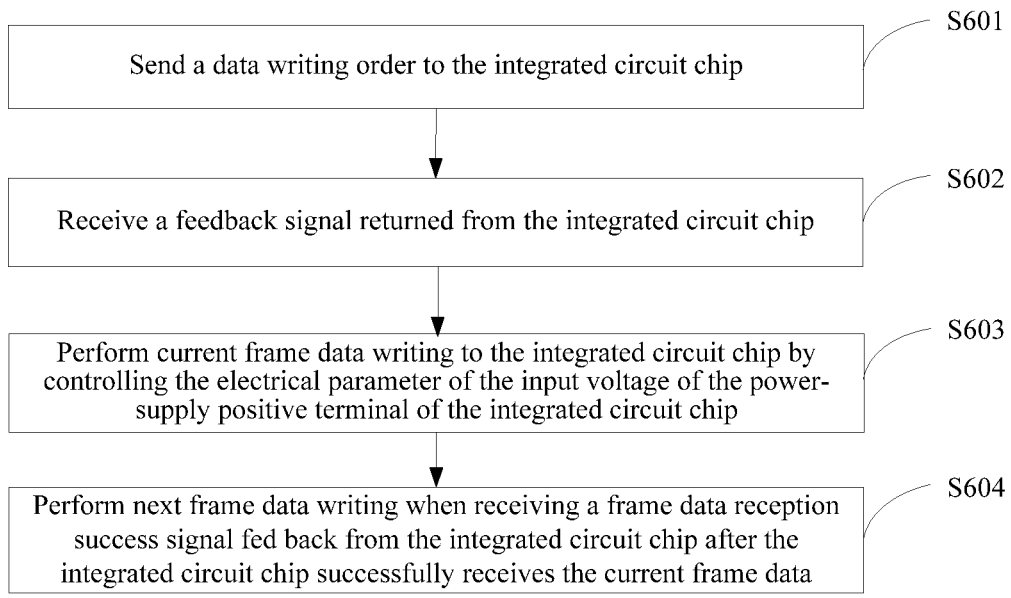
FIG. 6 is a schematic flowchart of an implementation process of another data writing method of an integrated circuit chip according to an embodiment of the present disclosure.

On the basis of the embodiment 1, in order to ensure the reliability of the communication between the writer and the integrated circuit chip, the embodiment 2 according to the present disclosure further improves the embodiment 1. The contents of the embodiment 2 which are the same as that of the embodiment 1 will not be repeatedly described and the corresponding descriptions of the embodiment 1 may be referred to. FIG. 6 is a schematic flowchart of the implementation process of another data writing method for an integrated circuit chip according to an embodiment of the present disclosure. The data writing method includes the steps of S601 to S604.

In S601, a data writing order is sent to the integrated circuit chip, where the data writing order is configured to instruct the integrated circuit chip to enter a data writing mode and to return a feedback signal after receiving the data writing order.

In S602, a feedback signal returned by the integrated circuit chip is received.

In S603, data writing of the current frame is performed to the integrated circuit chip by controlling the electrical parameter of the input voltage of the power-supply positive terminal of the integrated circuit chip.

The data transmission of the writer is performed by using frame data transmission, and the integrated circuit chip feeds back a frame data reception success signal to the writer after each frame data is successfully received. With this arrangement, the reliability of communication between the writer and the integrated circuit chip is ensured.

The writer performs current frame data writing to the integrated circuit chip by controlling the electrical parameter of the input voltage of the power-supply positive terminal of the integrated circuit chip and performs next frame data writing when receiving a frame data reception success signal fed back from the integrated circuit chip after the integrated circuit chip successfully receives the current frame data. The step is performed until all data is completely transmitted.

In S604, the next frame data writing is performed when the frame data reception success signal which is fed back by the integrated circuit chip after the integrated circuit chip successfully receives the current frame data is received.

When the signal is successfully received, the next frame data writing is performed.

It should be noted that, in an embodiment of the present disclosure, the integrated circuit chip enters the data writing mode and returns a feedback signal to enable the writer to perform data writing to the integrated circuit chip. However, those skilled in the art know that the integrated circuit chip will enter the data writing mode after receiving the data writing order, regardless of what kind of feedback signal is used by the integrated circuit chip to indicate that it successfully enters the data writing mode, or regardless of whether a feedback signal indicating the data writing mode has been successfully entered is returned or not, so that the writer can perform data writing to the integrated circuit chip. The manner in which the integrated circuit chip returns the feedback signal in this embodiment is merely an exemplary description and cannot be construed as a specific limitation on the present disclosure.

Embodiment 3

Figure 7:
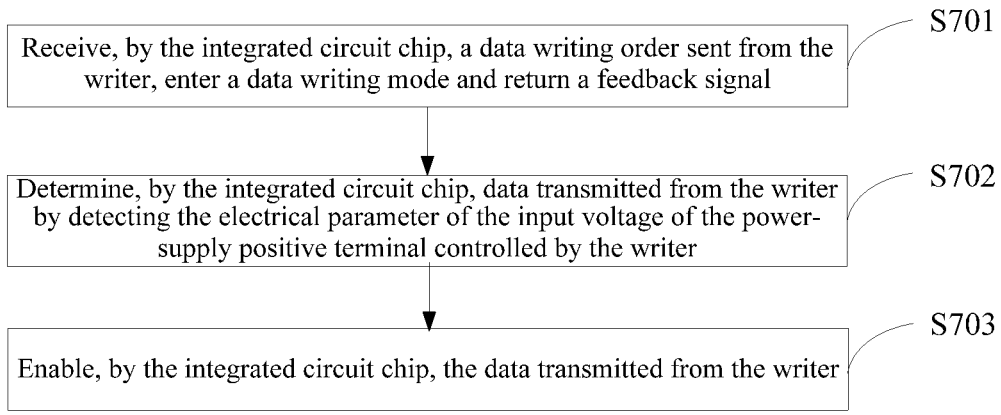
FIG. 7 is a schematic flowchart of another implementation process of a data writing method of an integrated circuit chip according to an embodiment of the present disclosure.

FIG. 7 is a schematic flowchart of an implementation process of a data writing method for an integrated circuit chip according to an embodiment of the present disclosure. The data writing method is suitable for the case of performing data writing to an integrated circuit chip, is applied to a product having an integrated circuit chip or to an integrated circuit chip, and can be implemented by software and/or hardware. For the details that are not described in detail in the embodiment 3, the corresponding descriptions of the embodiment 1 and the embodiment 2 may be referred to.

As shown in FIG. 7, the data writing method includes the steps of S701 to S703.

In S701, the integrated circuit chip receives a data writing order sent from the writer, enters a data writing mode and returns a feedback signal.

In S702, the integrated circuit chip determines the data transmitted from the writer by detecting the electrical parameter of the input voltage of the power-supply positive terminal controlled by the writer.

The integrated circuit chip determines the data transmitted from the writer by detecting the electrical parameter of the input voltage of the power-supply positive terminal and determining the detection result according to a preset rule set with the writer.

The preset rule includes a correspondence between the electrical parameter and the transmitted data. On one hand, it includes the correspondence between the magnitude of the input voltage and the transmitted data, for example, two input voltages with different magnitudes correspond to the transmitted data "0" and "1" respectively, for another example, eight input voltages with different magnitudes correspond to the transmitted data "0", "1", "2", "3", "4", "5", "6" and "7" respectively. On the other hand, it includes the correspondence between the frequency of the electrical signal superimposed on the input voltage and the transmitted data. For example, two input voltages with different frequencies respectively correspond to the transmitted data "0" and "1", for another example, eight input voltages with different magnitudes respectively correspond to the transmitted data "0", "1", "2" "3", "4", "5", "6" and "7".

As an embodiment of the present disclosure, the integrated circuit chip detects the electrical parameter of the input voltage of the power-supply positive terminal by a built-in or external second signal conversion circuit. Where, the second signal conversion circuit may be an A/D converter or a comparator. For example, if the writer controls the magnitude of the input voltage of the positive voltage of the power-supply positive terminal of the integrated circuit chip to be switched between two values, such as VCC-δ and VCC, the integrated circuit chip determines whether the data transmitted from the writer is "0" or "1" by using the preset rule. The preset rule may be that the transmitted data corresponding to the value VCC-δ is "0" and the transmitted data corresponding to the value VCC is "1". The preset rule may alternatively be the transmitted data corresponding to the value VCC-δ is "1" and the transmitted data corresponding to the value VCC is "0".

For another example, if the writer controls the magnitude of the input voltage of the positive voltage of the power-supply positive terminal of the integrated circuit chip to be switched between 8 values, the integrated circuit chip determines whether the data transmitted from the writer is "0", "1", "2", "3", "4", "5", "6" or "7" by using the preset rue. After the determination, the value is correspondingly converted to "000", "001", "010", "011", "100", "101", "110" or "111". It can be seen that compared with the data transmission using two input voltage values, data transmission using multiple input voltage values can greatly speed up the data transmission efficiency.

Similarly, using multiple frequency values for data transmission can also speed up the data transmission efficiency compared to data transmission using two frequency values.

In S703, the integrated circuit chip enables the data transmitted from the writer.

The integrated circuit chip enabling the data transmitted from the writer refers to that the integrated circuit chip updates the information in its built-in or external memory by using the data transmitted from the writer. After successfully enabling the data transmitted from the writer, the integrated circuit chip feeds back a data update success signal to the writer.

It should be noted that, in an embodiment of the present disclosure, the integrated circuit chip enters the data writing mode and returns a feedback signal to enable the writer to perform data writing to the integrated circuit chip. However, those skilled in the art know that the integrated circuit chip will enter the data writing mode after receiving the data writing order, regardless of what kind of feedback signal is used by the integrated circuit chip to indicate that it successfully enters the data writing mode, or regardless of whether a feedback signal indicating the data writing mode has been successfully entered is returned or not, so that the writer can perform data writing to the integrated circuit chip. The manner in which the integrated circuit chip returns the feedback signal in this embodiment is merely an exemplary description and cannot be construed as a specific limitation on the present disclosure.

It should be understood that, values of serial numbers of the steps in the above embodiments don't mean the execution sequence of the steps, the execution sequence of the steps should be determined by its function and internal logics, and should not be construed as limiting the implementation process of this embodiment of the present application.

Embodiment 4

FIG. 2 and FIG. 3 are schematic diagrams of a data writing system for an integrated circuit chip according to an embodiment of the present disclosure. The data writing system includes a writer and an integrated circuit chip, and the writer is electrically connected with the power-supply positive terminal and the power-supply negative terminal of the integrated circuit chip.

The writer is configured to send a data writing order to the integrated circuit chip, where the data writing order is configured to instruct the integrated circuit chip to enter a data writing mode and returns a feedback signal after receiving the data writing order, to receive the feedback signal returned from the integrated circuit chip, and to perform data writing to the integrated circuit chip by controlling the electrical parameter of the input voltage of the power-supply positive terminal of the integrated circuit chip.

In the embodiment of the present disclosure, the writer is electrically connected with the integrated circuit chip through 2 input lines of the power supply positive terminal and power supply negative terminal of the integrated circuit chip. The writer is externally connected with a power source to form a circuit loop.

The integrated circuit chip is configured to receive the data writing order sent from the writer, to enter the data writing mode, to return the feedback signal, to determine data transmitted from the writer by detecting the electrical parameter of the input voltage of the power-supply positive terminal controlled by the writer, and to enable the data transmitted from the writer.

Among them, the two-way communication mode is adopted between the writer and the integrated circuit chip. After the integrated circuit chip successfully enables the data transmitted from the writer, a data update success signal is fed back to the writer.

Figure 8:
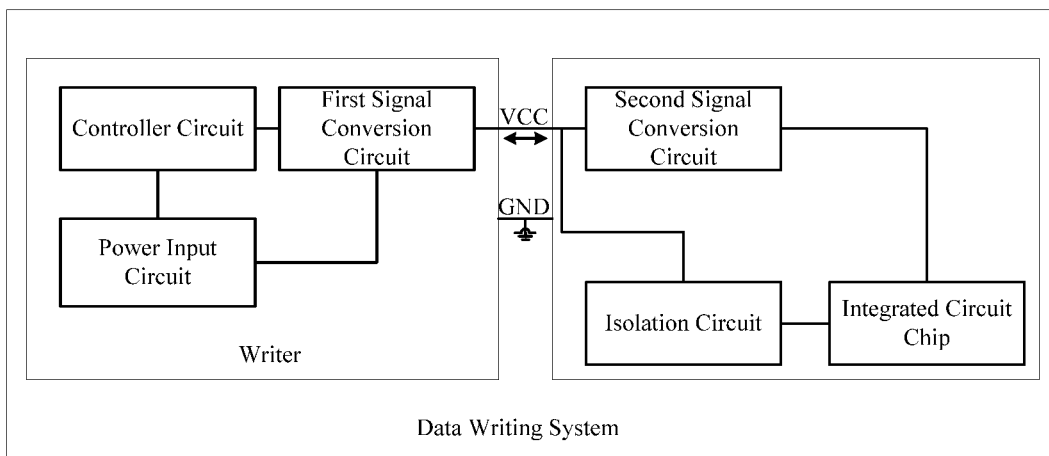
FIG. 8 is a schematic diagram of another data writing system for an integrated circuit chip according to an embodiment of the present disclosure.

Further, as shown in FIG. 8, the writer includes a controller and a first signal conversion circuit, and the controller is electrically connected with the power-supply positive terminal and the power-supply negative terminal of the integrated circuit chip through the first signal conversion circuit.

The controller is configured to:
send a data writing order to the integrated circuit chip, where the data writing order is configured to instruct the integrated circuit chip to enter the data writing mode and return a feedback signal after receiving the data writing order;
receive the feedback signal returned from the integrated circuit chip; and
control, by the first signal conversion circuit, the electrical parameter of the input voltage of the power-supply positive terminal of the integrated circuit chip to perform data writing to the integrated circuit chip.

Further, as shown in FIG. 8, the writer further includes a power input circuit, the power input circuit is electrically connected with the controller and the first signal conversion circuit respectively, and the power input circuit is configured to be externally connected with a power source to supply power to the controller and the first signal conversion circuit.

Further, as shown in FIG. 8, the data writing system further includes a second signal conversion circuit, the second signal conversion circuit is electrically connected with the first signal conversion circuit, the integrated circuit chip detects, by the second signal conversion circuit, the electrical parameter of the input voltage of the power-supply positive terminal controlled by the writer and determines the data transmitted from the writer.

The second signal conversion circuit may be externally connected or built in the integrated circuit chip. The integrated circuit chip detects the electrical parameter of the input voltage of the power-supply positive terminal by the second signal conversion circuit, such as the magnitude of the input voltage or the frequency of the electrical signal superimposed on the input voltage, and determines the detection result according to a preset rule set with the writer to determine the specific data sent from the writer.

Further, as shown in FIG. 8, the data writing system further includes an isolation circuit electrically connected with the integrated circuit chip, and the integrated circuit chip isolates a signal that interferes with the data transmission between the integrated circuit chip and the writer by the isolation circuit.

The isolation circuit can be externally connected with the integrated circuit chip.

It should be noted that, in an embodiment of the present disclosure, the integrated circuit chip enters the data writing mode and returns a feedback signal to enable the writer to perform data writing to the integrated circuit chip. However, those skilled in the art know that the integrated circuit chip will enter the data writing mode after receiving the data writing order, regardless of what kind of feedback signal is used by the integrated circuit chip to indicate that it successfully enters the data writing mode, or regardless of whether a feedback signal indicating the data writing mode has been successfully entered is returned or not, so that the writer can perform data writing to the integrated circuit chip. The manner in which the integrated circuit chip returns the feedback signal in this embodiment is merely an exemplary description and cannot be construed as a specific limitation on the present disclosure.

Embodiment 5

Figure 9:
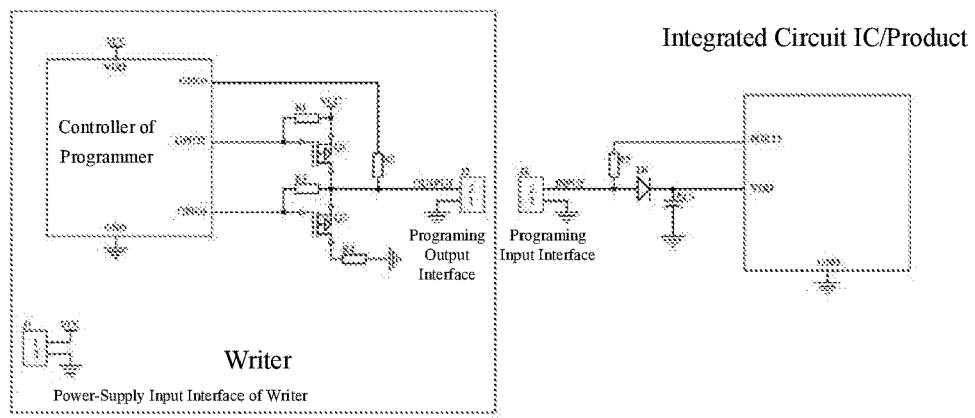
FIG. 9 is a schematic diagram of another data writing system for an integrated circuit chip according to an embodiment of the present disclosure.

FIG. 9 is a schematic diagram of a data writing system for an integrated circuit chip according to an embodiment of the present disclosure. The embodiment 5 further improves the embodiment 4. The contents of the embodiment 5 which are the same as that of the embodiment 4 will not be repeatedly described and the corresponding descriptions of the embodiment 4 may be referred to. Only the contents different from the embodiment 4 will be described.

FIG. 9 shows a circuit diagram when the first data conversion circuit built in the writer controls the input voltage of the power-supply positive terminal of the integrated circuit chip to be switched between VCC and 0, that is, the communication level between the writer and the integrated circuit chip can be switched between VCC and GND.

The power input circuit of the writer includes a power-supply input interface J1, and the first signal conversion circuit of the writer includes a programming output interface J2. The power-supply input interface J1 is electrically connected with the controller circuit and the first signal conversion circuit of the writer respectively and is configured to be externally connected with a power source to supply power to the controller circuit and the first signal conversion circuit of the writer. The second signal conversion circuit includes a programming input interface J3, and the programming input interface J3 is electrically connected with the programming output interface J2 of the writer.

Pin 2 of the programming input interface J3 is connected with the pin 2 of the programming output interface J2, and pin 1 of the programming input interface J3 and pin 1 of the programming output interface J2 are grounded. When the power-supply input interface J1 of the writer is externally connected with the power source, a circuit loop can be formed between the writer and the integrated circuit chip.

The controller of the writer includes the power-supply input pins VDD and GND, and the controller is powered by externally connecting the power-supply input interface J1 to a power source. The controller of the writer further includes input/output ports GPIO1, GPIO2, and GPIO3. The first signal conversion circuit includes a programming output interface J2, PMOS transistors Q1 and Q2, and resistors R1, R2, R3, and R4.

The input/output port GPIO1 is electrically connected with one end of the resistor R2, the other end of the resistor R2 is electrically connected with the pin 2 of the programming output interface J2, and the pin 1 of the programming output interface J2 is grounded. The input/output port GPIO2 is electrically connected with one end of the resistor R1, and the input/output port GPIO2 is also electrically connected with the gate of the PMOS transistor Q1. The other end of the resistor R1 and the source of the PMOS transistor Q1 are connected with the power source VCC, and the drain of the PMOS transistor Q1 is electrically connected with pin 2 of the programming output interface J2. The input/output port GPIO3 is electrically connected with one end of the resistor R3, the input/output port GPIO3 is also electrically connected with the gate of the PMOS transistor Q2, the other end of the resistor R3, and the source of the PMOS transistor Q2 are connected with the pin 2 of the programming output interface J2, the drain of the PMOS transistor Q2 is electrically connected with one end of the resistor R4, and the other end of the resistor R4 is grounded.

The integrated circuit chip includes a PORT1 pin, a VDD pin, and a GND pin, and the GND pin is grounded. The second signal conversion circuit includes a programming input interface J3 and a resistor R5. The isolation circuit includes a diode D1 and a capacitor C1. The PORT1 pin is an input/output interface of the integrated circuit chip.

The pin 2 of the programming input interface J3 is electrically connected with one end of the resistor R5, and the other end of the resistor R5 is electrically connected with the PORT1 pin of the integrated circuit chip. The pin 2 of the programming input interface J3 is also electrically connected with the anode of the diode D1, and the cathode of the diode D1 is electrically connected with the VDD pin of the integrated circuit chip and the anode of the capacitor C1, and the cathode of the capacitor C1 is grounded.

When the second signal conversion circuit establishes an electrical connection with the programming output interface J2 of the writer through the programming input interface J3 and the power-supply input interface J1 of the writer is externally connected with the power source, a circuit loop is formed between the writer and the integrated circuit chip. At this time, the input/output port GPIO2 of the controller of the writer is used to control the PMOS transistor Q1 to be turned on or turned off. Specifically, when the input/output port GPIO2 is low level 0, the PMOS transistor Q1 is turned on. At this time, the VCC level of the source of the PMOS transistor Q1 can be conducted from its source to its drain. As the drain of the PMOS transistor Q1 is electrically connected with the pin 2 of the programming output interface J2, the VCC level is conducted to the pin 2 of the programming output interface J2. When the port GPIO2 is high level 1, the PMOS transistor Q1 is turned off, at this time, the VCC level of source of the PMOS transistor Q1 cannot be conducted to the pin 2 of the programming output interface J2. It can be seen that the voltage of the pin 2 of the programming output interface J2 can be switched between the voltage values of VCC and 0 through the port GPIO2 of the controller circuit of the writer.

When the PMOS transistor Q1 is in the off state, the voltage of the source of the PMOS transistor Q2, that is, the voltage of the pin 2 of the programming output interface J2, can be conducted to the drain of the PMOS transistor Q2 by keeping the input/output port GPIO3 of the controller of the writer to a low level 0 for a period of time. Since the drain of the PMOS transistor Q2 is grounded through the resistor R4, the pin 2 of the programming output interface J2 can be discharged.

When the PMOS transistors Q1 and Q2 are both in the off state, the input/output port GPIO1 of the controller of the writer can receive the feedback signal sent from the integrated circuit chip.

When the voltage of the pin 2 of the programming output interface J2 of the writer is switched between two values VCC and 0, as the pin 2 of the programming input interface J3 at the integrated circuit chip side is electrically connected with the pin 2 of the programming output interface J2, the voltage of the pin 2 of the programming input interface J3 at the integrated circuit chip side is also switched between the two values VCC and 0 and is input into the PORT1 pin of the integrated circuit chip through the resistor R5. At this time, the integrated circuit chip determines the voltage of the PORT1 pin according to the preset rule set with the writer, so that the data specifically transmitted from the writer can be determined. In particular, when the voltage of the pin 2 of the programming input interface J3 is VCC, the capacitor C1 can be charged. When the voltage of the pin 2 of the programming input interface J3 is 0, the single-conductivity of the diode D1 helps to isolate the GND signal of the writer, so as to subtly ensure that the capacitor C1 only discharges the VDD pin of the integrated circuit chip to maintain the normal operation of the integrated circuit chip.

In addition, in order to ensure that the integrated circuit chip can work normally during the entire data writing process, the time during which the PMOS transistor Q1 is continuously turned off is controlled within a reasonable time range, thereby avoiding the situation that the integrated circuit chip does not work normally due to the voltage of the pin 2 of the programming input interface J3 being 0 for a long period of time. For example, the manner in which the PMOS transistor Q1 is maintained to be turned on for a preset period of time after data of a specific byte is transmitted by level switching can be employed. The preset period of time can be set in conjunction with the actual required efficiency of data transmission.

When the PMOS transistors Q1 and Q2 are both in the off state, the integrated circuit chip can send the feedback signal to the input/output port GPIO1 of the controller of the writer.

It should be noted that, in an embodiment of the present disclosure, the integrated circuit chip enters the data writing mode and returns a feedback signal to enable the writer to perform data writing to the integrated circuit chip. However, those skilled in the art know that the integrated circuit chip will enter the data writing mode after receiving the data writing order, regardless of what kind of feedback signal is used by the integrated circuit chip to indicate that it successfully enters the data writing mode, or regardless of whether a feedback signal indicating the data writing mode has been successfully entered is returned or not, so that the writer can perform data writing to the integrated circuit chip. The manner in which the integrated circuit chip returns the feedback signal in this embodiment is merely an exemplary description and cannot be construed as a specific limitation on the present disclosure.

Embodiment 6

Figure 10:
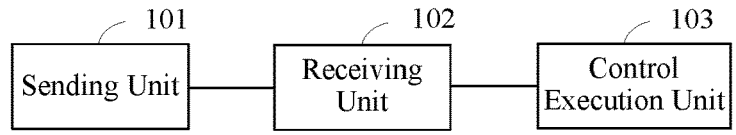
FIG. 10 is a schematic diagram of a data writing apparatus for an integrated circuit chip according to an embodiment of the present disclosure.

FIG. 10 is a schematic diagram of a data writing apparatus for an integrated circuit chip according to an embodiment of the present disclosure. The data writing apparatus for the integrated circuit chip is disposed in the writer. In the embodiment of the present disclosure, the integrated circuit chip is electrically connected with the writer through the power-supply positive terminal and the power-supply negative terminal.

As shown in FIG. 10, the data writing apparatus includes a sending unit 101, a receiving unit 102, and a control execution unit 103.

The sending unit 101 is configured to send a data writing order to the integrated circuit chip, wherein the data writing order is configured to instruct the integrated circuit chip to enter a data writing mode and returns a feedback signal after receiving the data writing order.

The receiving unit 102 is configured to receive the feedback signal returned from the integrated circuit chip.

The control execution unit 103 is configured to perform data writing to the integrated circuit chip by controlling the electrical parameter of the input voltage of the power-supply positive terminal of the integrated circuit chip.

Optionally, the control execution unit 103 is specifically configured to:

perform the data writing to the integrated circuit chip by controlling the magnitude of the input voltage of the power-supply positive terminal of the integrated circuit chip; or perform the data writing to the integrated circuit chip by controlling the frequency of the electrical signal superimposed on the input voltage of the power-supply positive terminal of the integrated circuit chip.

Optionally, the control execution unit 103 is specifically configured to perform the current frame data writing to the integrated circuit chip by controlling an electrical parameter of the input voltage of the power-supply positive terminal of the integrated circuit chip.

Correspondingly, the receiving unit 102 is further configured to perform next frame data writing when receiving a frame data reception success signal fed back from the integrated circuit chip after the integrated circuit chip successfully receives the current frame data.

It should be noted that, in an embodiment of the present disclosure, the integrated circuit chip enters the data writing mode and returns a feedback signal to enable the writer to perform data writing to the integrated circuit chip. However, those skilled in the art know that the integrated circuit chip will enter the data writing mode after receiving the data writing order, regardless of what kind of feedback signal is used by the integrated circuit chip to indicate that it successfully enters the data writing mode, or regardless of whether a feedback signal indicating the data writing mode has been successfully entered is returned or not, so that the writer can perform data writing to the integrated circuit chip. In the data writing apparatus according to the present embodiment, the manner in which the sending unit returns the feedback signal and the receiving unit receives the feedback signal is merely an exemplary description and cannot be construed as a specific limitation on the present disclosure.

Example 7

Figure 11:
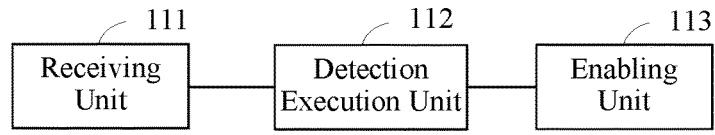
FIG. 11 is a schematic diagram of another data writing apparatus for an integrated circuit chip according to an embodiment of the present disclosure.

FIG. 11 is a schematic diagram of another data writing apparatus for an integrated circuit chip according to an embodiment of the present disclosure. The data writing apparatus for the integrated circuit chip is disposed in the integrated circuit chip. In the embodiment of the present disclosure, the integrated circuit chip is electrically connected with the writer through the power-supply positive terminal and the power-supply negative terminal.

As shown in FIG. 11, the data writing device includes a receiving unit 111, a detection execution unit 112, and an enabling unit 113.

The receiving unit 111 is configured to receive a data writing order sent from the writer, to enter a data writing mode, and to return a feedback signal.

The detection execution unit 112 is configured to determine data transmitted from the writer by detecting the electrical parameter of the input voltage of the power-supply positive terminal controlled by the writer.

The enabling unit 113 is configured to enable the data transmitted from the writer.

Optionally, the detection execution unit 112 is specifically configured to:

determine the data transmitted from the writer by detecting the magnitude of the input voltage of the power-supply positive terminal controlled by the writer; or determine the data transmitted from the writer by detecting the frequency of the electrical signal superimposed on the input voltage of the power-supply positive terminal controlled by the writer.

For the parts that are not in detailed described or recorded in the above embodiment, related descriptions in other embodiments may be referred to.

It should be noted that, in an embodiment of the present disclosure, the integrated circuit chip enters the data writing mode and returns a feedback signal to enable the writer to perform data writing to the integrated circuit chip. However, those skilled in the art know that the integrated circuit chip will enter the data writing mode after receiving the data writing order, regardless of what kind of feedback signal is used by the integrated circuit chip to indicate that it successfully enters the data writing mode, or regardless of whether a feedback signal indicating the data writing mode has been successfully entered is returned or not, so that the writer can perform data writing to the integrated circuit chip. In the data writing apparatus for an integrated circuit chip according to this embodiment, the manner in which the receiving unit returns the feedback signal is merely an exemplary description and cannot be construed as a specific limitation on the present disclosure.

It should be understood that, values of serial numbers of the steps in the above embodiments don't mean the execution sequence of the steps, the execution sequence of the steps should be determined by its function and internal logics, and should not be construed as limiting the implementation process of the embodiments of the present application.

Example Eight

Figure 12:
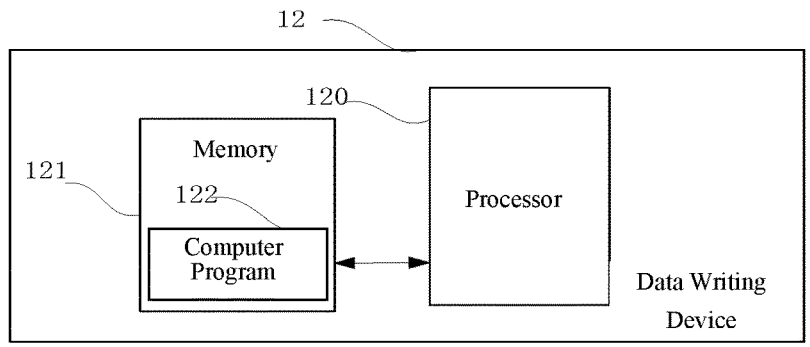
FIG. 12 is a schematic diagram of a data writing device for an integrated circuit chip according to an embodiment of the present disclosure.

FIG. 12 is a schematic diagram of a data writing device for an integrated circuit chip according to an embodiment of the present disclosure. As shown in FIG. 12, the device 12 of this embodiment includes a processor 120, a memory 121, and computer readable instructions 122 stored in the memory 121 and executable in the processor 120. When the processor 120 executes the computer readable instructions 122, the steps of the data writing method for the integrated circuit chip according to the above embodiments are implemented, such as steps 101 to 103 shown in FIG. 1, or the steps 701 to 703 shown in FIG. 7. Alternatively, when the processor 120 executes the computer readable instructions 122, the functions of the modules/units in the above apparatus embodiments are implemented, such as the functions of the units 101 to 103 shown in FIG. 10, or the functions of the units 111 to 113 shown in FIG. 11.

Illustratively, the computer readable instructions 122 may be divided into one or more modules/units that are stored in the memory 121 and executed by the processor 120, to complete this application. The one or more modules/units may be a series of instruction segments of the computer readable instructions capable of performing a particular function. The instruction segments are used to describe the execution process of the computer readable instructions 122 in the data writing device 12 for the integrated circuit chip.

For example, the computer readable instructions 122 may be divided into a sending unit, a receiving unit, and a control execution unit (units in a virtual device) and the functions of the respective units are as follows:

The sending unit is configured to send a data writing order to the integrated circuit chip, where the data writing order is configured to instruct the integrated circuit chip to enter a data writing mode and returns a feedback signal after receiving the data writing order.

The receiving unit is configured to receive the feedback signal returned from the integrated circuit chip;

The control execution unit is configured to perform the data writing to the integrated circuit chip by controlling the electrical parameter of the input voltage of the power-supply positive terminal of the integrated circuit chip.

As another example, the computer readable instructions 122 can be divided into a receiving unit, a detection execution unit, and an enabling unit (units in a virtual device) and the functions of the respective units are as follows.

The receiving unit is configured to receive a data writing order sent from the writer, to enter a data writing mode, and to return a feedback signal.

The detection execution unit is configured to determine the data transmitted from the writer by detecting the electrical parameter of the input voltage of the power-supply positive terminal controlled by the writer.

The enabling unit is configured to enable the data transmitted from the writer.

It should be noted that, in an embodiment of the present disclosure, the integrated circuit chip enters the data writing mode and returns a feedback signal to enable the writer to perform data writing to the integrated circuit chip. However, those skilled in the art know that the integrated circuit chip will enter the data writing mode after receiving the data writing order, regardless of what kind of feedback signal is used by the integrated circuit chip to indicate that it successfully enters the data writing mode, or regardless of whether a feedback signal indicating the data writing mode has been successfully entered is returned or not, so that the writer can perform data writing to the integrated circuit chip. In the data writing device according to the present embodiment, the manner in which the receiving unit included in the computer readable instructions 122 returns the feedback signal is merely an exemplary description and cannot be construed as a specific limitation on the present disclosure.

The data writing device 12 for the integrated circuit chip may be a computing device such as a desktop computer, a notebook, a palmtop computer, and a cloud server. The data writing device may include, but is not limited to, the processor 120 and the memory 121. It will be understood by those skilled in the art that FIG. 12 is merely an example of the data writing device 12, does not constitute a limitation to the data writing device 12. The data writing device may include more or less components than those illustrated, or may combine certain components, or may include different components. For example, the data writing device may also include input/output devices, network access devices, buses and the like.

The processor 120 may be a CPU, or may be another general purpose processor, a DSP, an Application Specific Integrated Circuit (ASIC), a Field-Programmable Gate Array (FPGA), or another programmable logic device, a discrete gate, a transistor logic device, or a discrete hardware component, etc. The general purpose processor may be a microprocessor, the processor, any conventional processor or the like.

The memory 121 may be an internal storage unit of the data writing device 12, such as a hard disk or an internal storage of the data writing device 12. The memory 121 may also be an external storage device of the data writing device 12, such as a plug-in hard disk equipped on the data writing device 12, a smart memory card (SMC), a secure digital (SD) card, or a flash card etc. Further, the memory 121 may alternatively include both an internal storage unit of the data writing device 12 and an external storage device. The memory 121 is configured to store the computer readable instructions and other programs and data required by the data writing device 12. The memory 121 can also be used to temporarily store data that has been output or is about to be output.

It can be clearly understood by those skilled in the art that, for describing conveniently and concisely, dividing of the aforesaid various functional units, functional modules is described exemplarily merely, in an actual application, the aforesaid functions can be assigned to different functional units and functional modules to be accomplished, that is, an inner structure of a data synchronizing device is divided into functional units or modules so as to accomplish the whole or a part of functionalities described above. The various functional units, modules in the embodiments can be integrated into a processing unit, or each of the units exists independently and physically, or two or more than two of the units are integrated into a single unit. The aforesaid integrated unit can by either actualized in the form of hardware or in the form of software functional units. In addition, specific names of the various functional units and modules are only used for distinguishing from each other conveniently, but not intended to limit the protection scope of the present application. Regarding a specific working process of the units and modules in the aforesaid device, reference can be made to a corresponding process in the aforesaid method embodiment, it is not repeatedly described herein.

In the above embodiments, a data writing method, system, apparatus, device and medium for an integrated circuit chip are provided. In the method, system, apparatus, device and medium, the writer performs the data writing to the integrated circuit chip by controlling the electrical parameter of the input voltage of the power-supply positive terminal of the integrated circuit chip. However, when the integrated circuit chip is externally connected with a Zener diode, a low dropout regulator (LDO), a DC circuit like a booster, or a power supply circuit, as these components or circuits have the characteristic of voltage regulation, that is, the characteristic of suppressing voltage fluctuation, the data loaded on the input voltage of the power-supply positive terminal of the integrated circuit chip by the writer cannot be effectively transmitted to the integrated circuit chip, which causes that the writer cannot realize the data writing to the integrated circuit chip. The following embodiments will describe a data writing method, system, apparatus, device, and medium for integrated circuit chips by controlling the electrical parameter of the input voltage of the power-supply negative terminal of the integrated circuit chip.

Example 9

Figure 13:
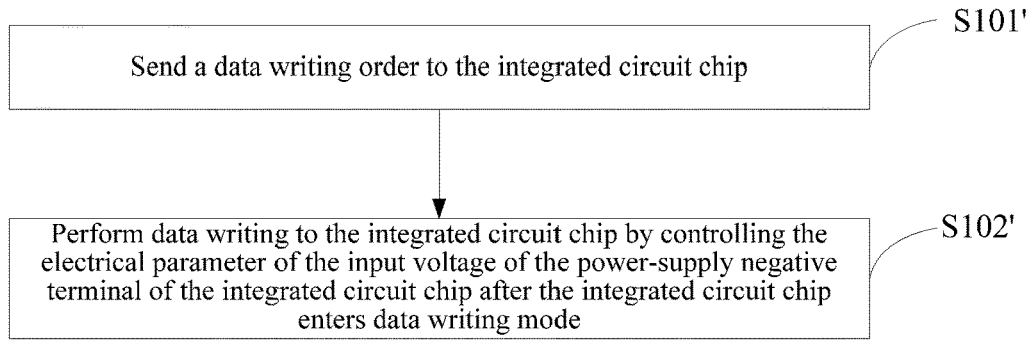
FIG. 13 is a schematic flowchart of an implementation process of another data writing method for an integrated circuit chip according to an embodiment of the present disclosure.

FIG. 13 is schematic flowchart of the implementation process of another data writing method for an integrated circuit chip according to an embodiment of the present disclosure. The data writing method is suitable for the case of performing data writing to the integrated circuit chip, is applied to the writer, and can be implemented by software and/or hardware.

For the details that are not described in detail in this embodiment, the corresponding description in the embodiment 1 may be referred to.

As shown in FIG. 13, the data writing method includes the steps of S101' to S102'.

In S101', a data writing order is sent to the integrated circuit chip, the data writing order is configured to instruct the integrated circuit chip to enter a data writing mode after receiving the data writing order.

Figure 14:
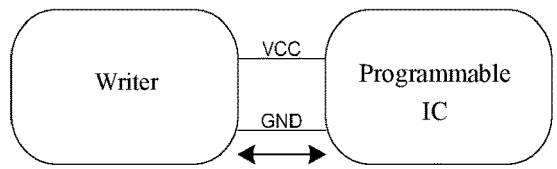
FIG. 14 is a schematic diagram of another data writing system of an integrated circuit chip according to an embodiment of the present disclosure.

In order to explain the present disclosure more clearly, in the description of the following specific embodiments, the manner that the integrated circuit chip is electrically connected with the writer through its own power-supply positive terminal and power-supply negative terminal and the writer performs the data writing to the integrated circuit chip by controlling the electrical parameter of the input voltage of the power-supply negative terminal of the integrated circuit chip will be described as an example. As shown in FIG. 14, the power-supply positive terminal is the power positive terminal VCC and the power-supply negative terminal is GND.

Figure 15:
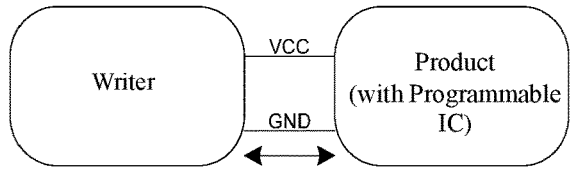
FIG. 15 is a schematic diagram of another data writing system of an integrated circuit chip according to an embodiment of the present disclosure.

It should be noted that after the integrated circuit chip being packaged to become a product, a battery holder for powering the product is generally provided, and the battery holder is connected with the 2 input lines of the power-supply positive terminal and the power-supply negative terminal of the integrated circuit chip. Thus the battery on the battery holder can be isolated for power supply, or the power-supply battery may be taken out from the battery holder and the integrated circuit chip is electrically connected with the writer directly through the contact of the power positive terminal of and the contact of the power negative terminal on the battery holder, as shown in FIG. 15. And the writer is externally connected with a power source to form a circuit loop.

The writer sends a data writing order to the integrated circuit chip. The data writing order is configured to instruct the integrated circuit chip to enter the data writing mode after receiving the data writing order.

The data writing mode refers to a preparation state in which the integrated circuit chip responds to data writing by the writer. The data writing order is used to instruct the integrated circuit chip to enter the data writing mode after receiving the data writing order.

As an embodiment of the present disclosure, the writer includes a controller configured to send orders to the integrated circuit chip. After receiving the order sent from the writer, the integrated circuit chip detects and determines the sent order by the built-in or external second signal conversion circuit. If the sent order is a data writing order, the integrated circuit chip enters the data writing mode and sends a feedback signal indicating that the data writing mode has been entered to the writer. The integrated circuit chip sending the feedback signal indicating that the data writing mode has been entered means that the integrated circuit chip feeds back a signal indicating that it enters the data writing mode to the writer, or the integrated circuit chip controls an LED electrically connected with the integrated circuit chip to flash and/or controls a speaker to generate a sound to prompt that the integrated circuit chip successfully enters the data writing mode. With this configuration, engineers who monitor the data writing can more quickly and intuitively determine that the integrated circuit chip has successfully entered the data writing mode, facilitating the engineers to monitor the entire process and further improving efficiency.

For details that are not described in detail in this step, the corresponding description of step S101 in the embodiment 1 may be referred to.

In S102', the data writing is performed to the integrated circuit chip by controlling the electrical parameters of the input voltage of the power-supply negative terminal of the integrated circuit chip after the integrated circuit chip enters the data writing mode.

The data writing refers to that the writer transmits the data that needs to be written into the integrated circuit chip to the integrated circuit chip, thereby updating the information in the built-in or external memory of the integrated circuit chip.

Controlling the electrical parameter of the input voltage of the power-supply negative terminal of the integrated circuit chip may be controlling the magnitude of the input voltage, such as a square wave voltage, of the power-supply negative terminal of the integrated circuit chip or may be controlling the frequency of an electrical signal superimposed on the input voltage of the power-supply negative terminal of the integrated circuit chip, for example, controlling the frequency of the sinusoidal signal superimposed on the input voltage of the power-supply negative terminal of the integrated circuit chip, for another example, controlling the frequency of the triangular wave, the sawtooth wave or the like, which are superimposed on the input voltage of the power-supply negative terminal of the integrated circuit chip. It should be noted that the description herein is merely exemplary and should not be construed as limiting the disclosure.

In the embodiment of the present disclosure, the writer includes a first signal conversion circuit, and the writer performs the data writing to the integrated circuit chip by controlling the electrical parameter of the input voltage of the power-supply negative terminal of the integrated circuit chip by its built-in first signal conversion circuit.

As an embodiment of the present disclosure, the writer performing the data writing to the integrated circuit chip by controlling the magnitude of the input voltage of the power-supply negative terminal of the integrated circuit chip refers to that the writer changes the magnitude of the input voltage of the input voltage of the power-supply negative terminal of the integrated circuit chip by its built-in first signal conversion circuit to transmit binary data "0" and As another embodiment of the present disclosure, the writer performing the data writing to the integrated circuit chip by controlling the frequency of the sinusoidal signal superimposed on the input voltage of the power-supply negative terminal of the integrated circuit chip refers to that the writer changes the frequency of the sinusoidal signal superimposed on the input voltage of the power-supply negative terminal of the integrated circuit chip by its built-in first signal conversion circuit to transmit binary data "0" and "1".

In addition, various numbers of different frequencies of the sinusoidal signal that superimposed on the input voltage may be selected, for example, at least 2, 3 or more may be selected. By selecting the different frequencies of the sinusoidal signal with larger number, the transmission efficiency of the transmitted data can be made higher, thereby further improving the efficiency of data writing. For example, as shown in FIG. 5, by controlling the frequency of the sinusoidal signal superimposed on the input voltage of the power-supply negative terminal of the integrated circuit chip to be switched between f1 and f2, the binary data "0" and "1" can be transmitted.

The existing writers perform data writing to a memory integrated in or external to the integrated circuit chip through a specific interface of the integrated circuit chip, such as a JTAG interface, which at least use four lines. In the technical solution provided by the present disclosure, only 2 input lines of the power-supply positive terminal and the power-supply negative terminal of the integrated circuit chip is required to complete the data writing, which is simpler and more convenient. In addition, since the data writing in the present disclosure no longer depends on a specific interface such as JTAG, the cost of manufacturers binding chip is subtly reduced. Further, in the technical solution provided in the present disclosure, the writer performs the data writing to the integrated circuit chip by controlling the electrical parameter of the input voltage of the power-supply negative terminal of the integrated circuit chip, which can solve the technical problem that when the integrated circuit chip is externally connected with the voltage regulator device, the data loaded on the input voltage of the power-supply positive terminal of the integrated circuit chip by the writer cannot be effectively transmitted to the integrated circuit chip and the data writing to the integrated circuit chip cannot be realized.

For details that are not described in detail in this step, the corresponding description of step S103 in embodiment 1 may be referred to.

Example 10

Figure 16:
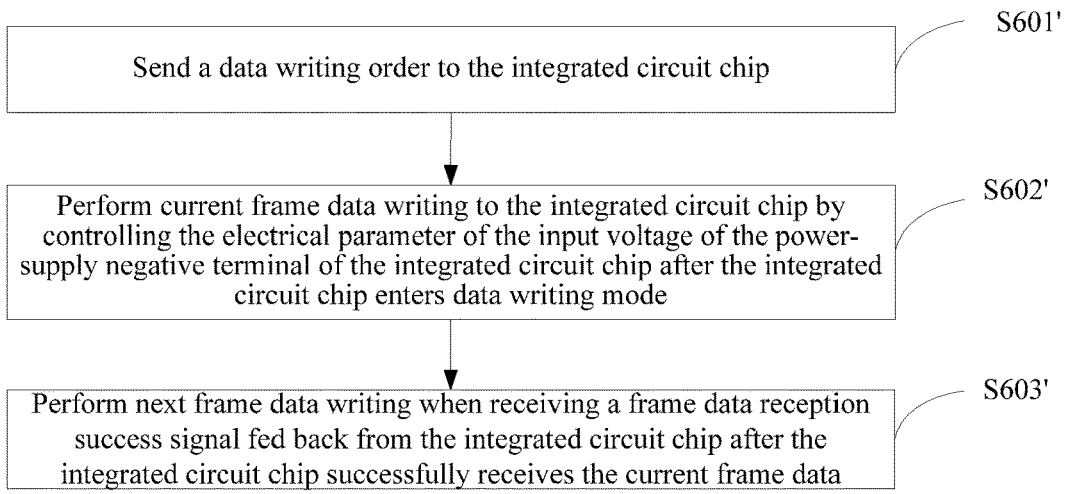
FIG. 16 is a schematic flowchart of an implementation process of another data writing method for an integrated circuit chip according to an embodiment of the present disclosure.

On the basis of the above embodiment 9, in order to ensure the reliability of communication between the writer and the integrated circuit chip, the embodiment 10 according to the present disclosure further improves the embodiment 9. The contents of the embodiment 10 which are the same as that of the embodiment 9 will not be repeatedly described and the corresponding descriptions of the embodiment 9 may be referred to. FIG. 16 is a schematic flowchart of the implementation process of another data writing method for an integrated circuit chip according to an embodiment of the present disclosure. The data writing method includes the steps of S601' to S603'.

In S601', a data writing order is sent to the integrated circuit chip, where the data writing order is configured to instruct the integrated circuit chip to enter a data writing mode after receiving the data writing order.

In S602', current frame data writing is performed to the integrated circuit chip by controlling the electrical parameter of the input voltage of the power-supply negative terminal of the integrated circuit chip after the integrated circuit chip enters the data writing mode.

The writer performs current frame data writing to the integrated circuit chip by controlling the electrical parameter of the input voltage of the power-supply negative terminal of the integrated circuit chip and performs next frame data writing when receiving a frame data reception success signal fed back from the integrated circuit chip after the integrated circuit chip successfully receives the current frame data. The step is performed until all data is completely transmitted.

For details that are not described in detail in this step, the description of step S603 in the embodiment 2 may be referred to.

In S603', the next frame data writing is performed when receiving the frame data reception success signal fed back by the integrated circuit chip after the integrated circuit chip successfully receives the current frame data.

Embodiment 11

Figure 17:
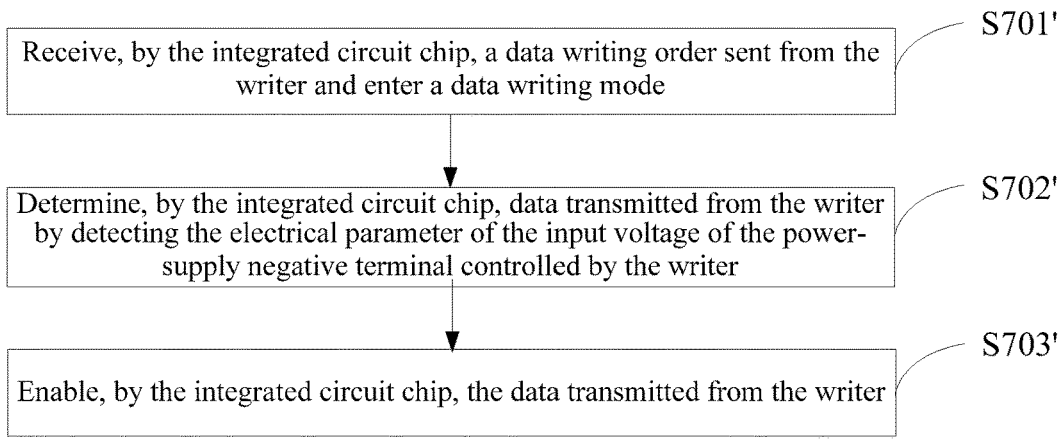
FIG. 17 is a schematic flowchart of an implementation process of another data writing method for an integrated circuit chip according to an embodiment of the present disclosure.

FIG. 17 is a schematic flowchart of an implementation process of a data writing method for an integrated circuit chip according to an embodiment of the present disclosure. The data writing method is suitable for the case of performing data writing to an integrated circuit chip, is applied to a product having an integrated circuit chip or to an integrated circuit chip, and can be implemented by software and/or hardware. For the details that are not described in detail in the embodiment 11, the corresponding descriptions of the embodiment 9 and the embodiment 10 may be referred to.

As shown in FIG. 17, the data writing method includes the steps of S701' to S703'.

In S701', the integrated circuit chip receives a data writing order sent from the writer and enters a data writing mode.

In S702', the integrated circuit chip determines the data transmitted from the writer by detecting the electrical parameter of the input voltage of the power-supply negative terminal controlled by the writer.

The integrated circuit chip determines the data transmitted from the writer by detecting the electrical parameter of the input voltage of the power-supply negative terminal and determining the detection result according to a preset rule set with the writer.

As an embodiment of the present disclosure, the integrated circuit chip detects the electrical parameter of the input voltage of the power-supply negative terminal by a built-in or external second signal conversion circuit. Where, the second signal conversion circuit may be an A/D converter or a comparator. For example, if the writer controls the magnitude of the input voltage of the positive voltage of the power-supply negative terminal of the integrated circuit chip to be switched between two values, such as VCC-δ and VCC, the integrated circuit chip determines whether the data transmitted from the writer is "0" or "1" by using the preset rule. The preset rule may be that the transmitted data corresponding to the value VCC-δ is "0" and the transmitted data corresponding to the value VCC is "1". The preset rule may alternatively be the transmitted data corresponding to the value VCC-δ is "1" and the transmitted data corresponding to the value VCC is "0".

For another example, if the writer controls the magnitude of the input voltage of the positive voltage of the power-supply negative terminal of the integrated circuit chip to be switched between 8 values, the integrated circuit chip determines whether the data transmitted from the writer is "0", "1", "2", "3", "4", "5", "6" or "7" by using the preset rue. After the determination, the value is correspondingly converted to "000", "001", "010", "011", "100", "101", "110" or "111". It can be seen that compared with the data transmission using two input voltage values, data transmission using multiple input voltage values can greatly speed up the data transmission efficiency.

Similarly, using multiple frequency values for data transmission can also speed up the data transmission efficiency compared to data transmission using two frequency values.

For details that are not described in detail in this step, the corresponding description in the step S702 of the embodiment 3 may be referred to.

In S703', the integrated circuit chip enables the data transmitted from the writer.

The integrated circuit chip enabling the data transmitted from the writers refers to that the integrated circuit chip updates the information in its built-in or external memory by using the data transmitted from the writer. After successfully enabling the data transmitted from the writer, the integrated circuit chip feeds back a data update success signal to the writer.

It should be understood that, values of serial numbers of the steps in the above embodiments don't mean the execution sequence of the steps, the execution sequence of the steps should be determined by its function and internal logics, and should not be construed as limiting the implementation process of this embodiment of the present application.

Embodiment 12

FIG. 14 and FIG. 15 are schematic diagrams of another data writing system for an integrated circuit chip according to an embodiment of the present disclosure. The data writing system includes a writer and an integrated circuit chip, and the writer is electrically connected with the power-supply positive terminal and the power-supply negative terminal of the integrated circuit chip.

The writer is configured to send a data writing order to the integrated circuit chip, where the data writing order is configured to instruct the integrated circuit chip to enter a data writing mode after receiving the data writing order, and to perform the data writing to the integrated circuit chip by controlling the electrical parameter of the input voltage of the power-supply negative terminal of the integrated circuit chip after the integrated circuit chip enters the data writing mode.

In the embodiment of the present disclosure, the writer is electrically connected with the integrated circuit chip through 2 input lines of the power supply positive terminal and power supply negative terminal of the integrated circuit chip. The writer is externally connected with a power source to form a circuit loop.

The integrated circuit chip is configured to receive the data writing order sent from the writer, to enter the data writing mode, to determine data transmitted from the writer by detecting the electrical parameter of the input voltage of the power-supply negative terminal controlled by the writer, and to enable the data transmitted from the writer.

After successfully enabling the data transmitted from the writer, the integrated circuit chip feeds back a data update success signal to the writer.

Figure 18:
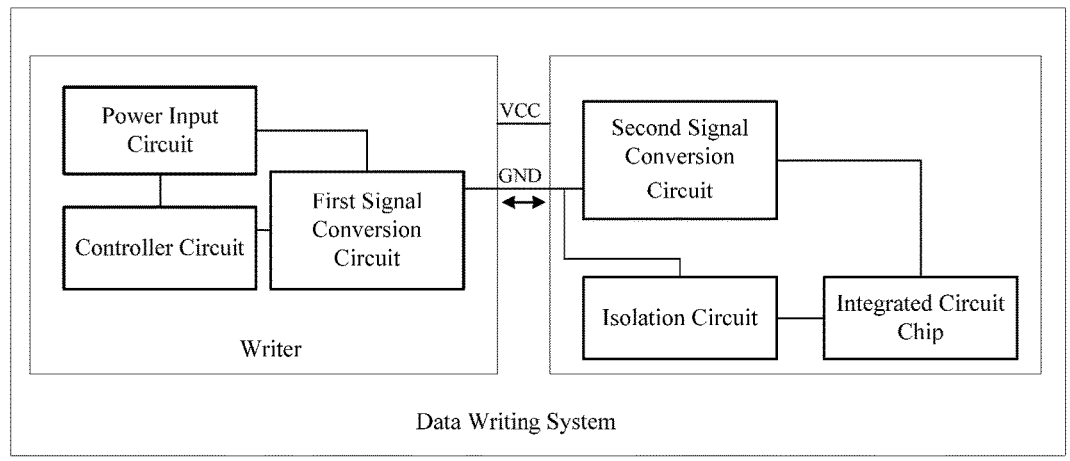
FIG. 18 is a schematic diagram of another data writing system for an integrated circuit chip according to an embodiment of the present disclosure.

Further, as shown in FIG. 18, the writer includes a controller and a first signal conversion circuit, and the controller is electrically connected with the power-supply positive terminal and the power-supply negative terminal of the integrated circuit chip through the first signal conversion circuit.

The controller is configured to:

send a data writing order to the integrated circuit chip, where the data writing order is configured to instruct the integrated circuit chip to enter the data writing mode after receiving the data writing command; and control, by the first signal conversion circuit, the electrical parameter of the input voltage of the power-supply negative terminal of the integrated circuit chip to perform data writing to the integrated circuit chip.

Further, as shown in FIG. 18, the writer further includes a power input circuit, the power input circuit is electrically connected with the controller and the first signal conversion circuit respectively, and the power input circuit is configured to be externally connected with a power source to supply power to the controller and the first signal conversion circuit.

Further, as shown in FIG. 18, the data writing system further includes a second signal conversion circuit, the second signal conversion circuit is electrically connected with the first signal conversion circuit, the integrated circuit chip detects, by the second signal conversion circuit, the electrical parameter of the input voltage of the power-supply negative terminal controlled by the writer and determines the data transmitted from the writer.

The second signal conversion circuit may be externally connected or built in the integrated circuit chip. The integrated circuit chip detects the electrical parameter of the input voltage of the power-supply negative terminal by the second signal conversion circuit, such as the magnitude of the input voltage or the frequency of the electrical signal superimposed on the input voltage, and determines the detection result according to a preset rule set with the writer to determine the specific data sent from the writer.

Further, as shown in FIG. 18, the data writing system further includes an isolation circuit electrically connected with the integrated circuit chip, and the integrated circuit chip isolates a signal that interferes with the data transmission between the integrated circuit chip and the writer by the isolation circuit.

The isolation circuit can be externally connected with the integrated circuit chip.

Example 13

Figure 19:
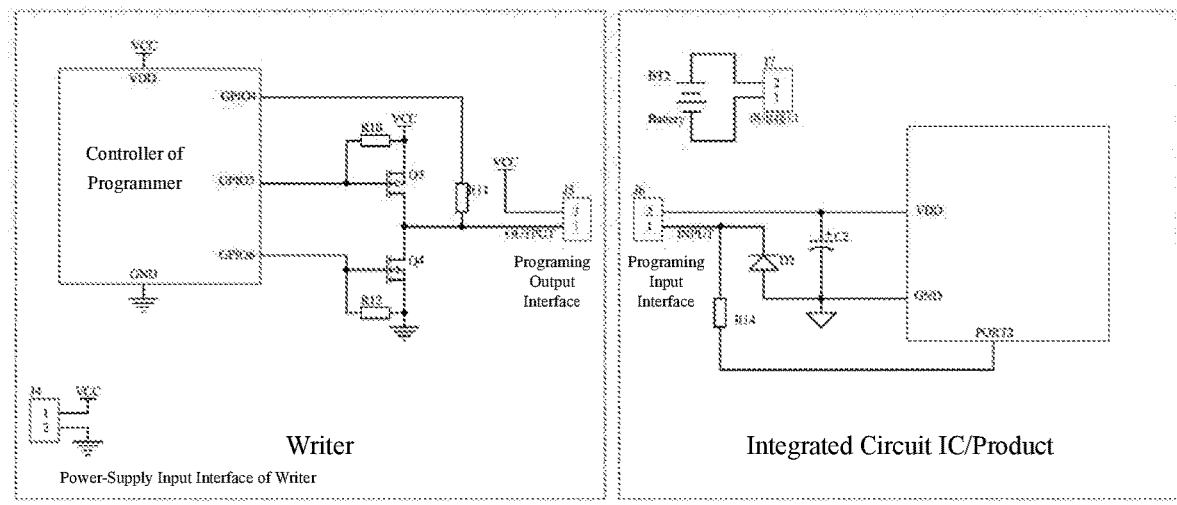
FIG. 19 is a schematic diagram of another data writing system for an integrated circuit chip according to an embodiment of the present disclosure.

FIG. 19 is a schematic diagram of another data writing system for an integrated circuit chip according to an embodiment of the present disclosure. The embodiment 13 further improves the embodiment 12. The contents of the embodiment 13 which are the same as that of the embodiment 12 will not be repeatedly described and the corresponding descriptions of the embodiment 12 may be referred to. Only the contents different from the embodiment 12 will be described.

FIG. 19 shows a circuit diagram when the first data conversion circuit built in the writer controls the input voltage of the power-supply negative terminal of the integrated circuit chip to be switched between VCC and 0, that is, the communication level between the writer and the integrated circuit chip can be switched between VCC and GND.

The power input circuit of the writer includes a power-supply input interface J4, and the first signal conversion circuit of the writer includes a programming output interface J5. The power-supply input interface J4 is electrically connected with the controller circuit and the first signal conversion circuit of the writer respectively and is configured to be externally connected with a power source to supply power to the controller circuit and the first signal conversion circuit of the writer. The second signal conversion circuit includes a programming input interface J6, and the programming input interface J6 is electrically connected with the programming output interface J5 of the writer.

Pin 2 of the programming input interface J6 is connected with the pin 2 of the programming output interface J5, and pin 2 of the programming output interface J5 is connected with a power source VCC. When the power-supply input interface J4 of the writer is externally connected with an external power source, a circuit loop can be formed between the writer and the integrated circuit chip.

The controller of the writer includes the power-supply input pins VDD and GND, and the controller is powered by externally connecting the power-supply input interface J4 to a power source. The controller of the writer further includes input/output ports GPIO4, GPIO5, and GPIO6. The first signal conversion circuit includes a programming output interface J5, a PMOS transistor Q3, a NMOS transistor Q4, and resistors R10, R11 and R12.

The input/output port GPIO4 is electrically connected with one end of the resistor R11, and the other end of the resistor R11 is electrically connected with the pin 1 of the programming output interface J5. The input/output port GPIO5 is electrically connected with one end of the resistor R10, and the input/output port GPIO5 is also electrically connected with the gate of the PMOS transistor Q3. The other end of the resistor R10 and the source of the PMOS transistor Q3 are connected with the power source VCC, and the drain of the PMOS transistor Q3 is electrically connected with the pin 1 of the programming output interface J5. The input/output port GPIO6 is electrically connected with one end of the resistor R12, the input/output port GPIO6 is also electrically connected with the gate of the NMOS transistor Q4, the other end of the resistor R12 and the source of the NMOS transistor Q4 are grounded, and the drain of the NMOS transistor Q4 is electrically connected with the pin 1 of the programming output interface J5.

The integrated circuit chip includes a PORT2 pin, a VDD pin, and a GND pin. The second signal conversion circuit includes a programming input interface J6 and a resistor R14; the isolation circuit includes a diode D2 and a capacitor C2. The PORT2 pin is an input/output interface of the integrated circuit chip.

The pin 1 of the programming input interface J6 is electrically connected with one end of the resistor R14, and the other end of the resistor R14 is electrically connected with the PORT2 pin of the integrated circuit chip. The pin 1 of the programming input interface J6 is also electrically connected with the cathode of the diode D2. The anode of the diode D2 is electrically connected with the GND pin of the integrated circuit chip, and the GND pin of the integrated circuit chip is grounded. The pin 2 of the programming input interface J6 is electrically connected with the VDD pin of the integrated circuit chip and the anode of the capacitor C2 respectively, and the cathode of the capacitor C2 is grounded.

When the second signal conversion circuit establishes an electrical connection with the programming output interface J5 of the writer through the programming input interface J6, and the power-supply input interface J4 of the writer is externally connected with the power source, a circuit loop is formed between the writer and the integrated circuit chip. At this time, the input/output port GPIO5 of the controller of the writer is used to control the PMOS transistor Q3 to be turned on or turned off, and the input/output port GPIO6 of the controller of the writer is used to control the NMOS transistor Q4 to be turned on or turned off. Specifically, when the input/output ports GPIO5 and GPIO6 are low level 0, the PMOS transistor Q3 is turned on, and the NMOS transistor Q4 is turned off. At this time, the VCC level of the source of the PMOS transistor Q3 can be conducted from its source to its drain. As the drain of the PMOS transistor Q3 is electrically connected with the pin 1 of the programming output interface J5, the VCC level is conducted to the pin 1 of the programming output interface J5. When the ports GPIO5 and GPIO6 are high level 1, the PMOS transistor Q3 is turned off, and the NMOS transistor Q4 is turned on. At this time, the drain and the source of the NMOS transistor Q4 are conducted with each other. As the drain of the NMOS transistor Q4 is electrically connected with the pin 1 of the programming output interface J5, the level of pin 1 of the programming output interface J5 is pulled down to GND by the source of the NMOS transistor Q4. It can be seen that the voltage of the pin 1 of the programming output interface J5 can be switched between the voltage values of VCC and 0 through the ports GPIO5 and GPIO6 of the controller circuit of the writer.

When the port GPIO5 is high level 1, the port GPIO6 is low level 0, and the PMOS transistor Q3 and the NMOS transistor Q4 are both turned off, the PORT2 pin is set as output, and the input/output port GPIO4 of the controller of the writer can receives the feedback signal sent from the PORT2 pin of the integrated circuit chip through the pin 1 of the programming output interface J5.

When the voltage of the pin 1 of the programming output interface J5 of the writer is switched between two values VCC and 0, as the pin 1 of the programming input interface J6 at the integrated circuit chip side is electrically connected with the pin 1 of the programming output interface J5 and the PORT2 pin of the integrated circuit chip is set as input, the voltage of the pin 1 of the programming input interface J6 at the integrated circuit chip side is also switched between the two values VCC and 0 and is input into the PORT2 pin of the integrated circuit chip through the resistor R14. At this time, the integrated circuit chip determines the voltage of the PORT2 pin according to the preset rule set with the writer, so that the data specifically transmitted from the writer can be determined. In particular, when the voltage of the pin 1 of the programming input interface J6 is 0, the capacitor C2 can be charged. When the voltage of the pin 1 of the programming input interface J6 is VCC, the single-conductivity of the diode D2 helps to isolate the pin1 of the programming input interface J6 with the GND pin of the integrated circuit chip, so as to subtly ensure that the capacitor C2 discharges the VDD pin of the integrated circuit chip to maintain the normal operation of the integrated circuit chip, and to ensure that the voltage of the pin 1 of the programming input interface J6 is input into the PORT2 pin of the integrated circuit chip through the resistor R14.

When both the PMOS transistor Q3 and the NMOS transistor Q4 are in the off state, the integrated circuit chip can send the feedback signal to the input/output port GPIO4 of the controller of the writer through the PORT2 pin.

When the integrated circuit chip is in a normal working state, the programming input interface J6 is electrically connected with the BT2 battery or a DC power-supply terminal connected with the power-supply interface J7. When the writer performs data writing to the integrated circuit chip, the programming input interface J6 is disconnected from the power-supply interface J7, and the programming input interface J6 is electrically connected with the programming output interface J5.

The writer or the integrated circuit chip terminal does not send and receive at the same time. The writer needs to send a data writing order to the integrated circuit chip, and to be immediately switched to be an input circuit after sending the data writing order to wait for receiving the signal sent from the integrated circuit chip.

In addition, in order to ensure that the integrated circuit chip can work normally during the entire data writing process, the time during which the PMOS transistor Q3 is continuously turned on and the NMOS transistor Q4 is continuously turned off is controlled within a reasonable time range, thereby avoiding the situation that the integrated circuit chip does not work normally due to the voltage of the pin 1 of the programming input interface J6 being VCC for a long period of time. For example, the manner in which the PMOS transistor Q3 is maintained to be turned on and the NOMS transistor Q4 is maintained to be turned off for a preset period of time after data of a specific byte is transmitted by level switching can be employed. The preset period of time can be set in conjunction with the actual required efficiency of data transmission.

In this embodiment, the model of the controller type of the writer is GD32F150G8U6, STM32F103CBT6 or TR16F801B, the model of the integrated circuit chip is TR16F064B, GD32 series parent, or STM32 series parent, These are only the examples of the modes of the controller of the writer and the integrated circuit chip model and should not be construed as limiting the present disclosure.

It should be noted that the diode D2 and the resistor R14 at the integrated circuit chip side in this embodiment may alternatively be disposed inside the integrated circuit chip. In addition, the circuit in this embodiment is for fully explaining the process of performing data writing to the integrated circuit chip by controlling the electrical parameter of the input voltage of the power-supply negative terminal of the integrated circuit chip by the writer, and does not limit the circuit of the writer for controlling the electrical parameter of the input voltage of the power-supply negative terminal of the integrated circuit chip. In fact, there are various circuits that can realize the process. For example, the diode D2 at the integrated circuit chip side may be replaced by a MOS transistor, and may alternatively be replaced by a triode or other gate circuit. The circuit including Q3 and Q4 at the writer side may alternatively be realized by a device or a circuit having the same function as a motor drive, a switch circuit or the like. The circuits formed by these alternatives are all within the protection scope of the present disclosure.

Example 14

Figure 20:
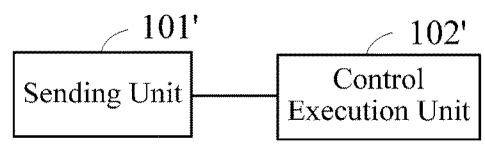
FIG. 20 is a schematic diagram of another data writing device for an integrated circuit chip according to an embodiment of the present disclosure.

FIG. 20 is a schematic diagram of another data writing apparatus for an integrated circuit chip according to an embodiment of the present application. The data writing apparatus for the integrated circuit chip is disposed in the writer. In the embodiment of the present application, the integrated circuit chip is electrically connected with the writer through the power-supply positive terminal and the power-supply negative terminal.

As shown in FIG. 20, the data writing apparatus includes a sending unit 101' and a control execution unit 102'.

The sending unit 101' is configured to send a data writing order to the integrated circuit chip, wherein the data writing order is configured to instruct the integrated circuit chip to enter a data writing mode after receiving the data writing order;

The control execution unit 102' is configured to perform data writing to the integrated circuit chip by controlling the electrical parameter of the input voltage of the power-supply negative terminal of the integrated circuit chip after the integrated circuit chip enters the data writing mode.

Optionally, the control execution unit 102' is specifically configured to:

perform the data writing to the integrated circuit chip by controlling the magnitude of the input voltage of the power-supply negative terminal of the integrated circuit chip; or perform the data writing to the integrated circuit chip by controlling the frequency of the electrical signal superimposed on the input voltage of the power-supply negative terminal of the integrated circuit chip.

Optionally, the control execution unit 102' is specifically configured to perform the current frame data writing to the integrated circuit chip by controlling an electrical parameter of the input voltage of the power-supply negative terminal of the integrated circuit chip.

Correspondingly, the control execution unit 102' is further configured to perform next frame data writing when receiving a frame data reception success signal fed back from the integrated circuit chip after the integrated circuit chip successfully receives the current frame data.

Example 15

FIG. 11 is a schematic diagram of another data writing apparatus of an integrated circuit chip according to an embodiment of the present disclosure.

The data writing apparatus for the integrated circuit chip is disposed in the integrated circuit chip. In the embodiment of the present disclosure, the integrated circuit chip is electrically connected with the writer through the power-supply positive terminal and the power-supply negative terminal.

As shown in FIG. 11, the data writing apparatus includes a receiving unit 111, a detection execution unit 112, and an enabling unit 113.

The receiving unit 111 is configured to receive a data writing order sent from the writer, and to enter a data writing mode.

The detection execution unit 112 is configured to determine data transmitted from the writer by detecting the electrical parameter of the input voltage of the power-supply negative terminal controlled by the writer.

The enabling unit 113 is configured to enable the data transmitted from the writer.

Optionally, the detection execution unit 112 is specifically configured to:

determine the data transmitted from the writer by detecting the magnitude of the input voltage of the power-supply negative terminal controlled by the writer; or determine the data transmitted from the writer by detecting the frequency of the electrical signal superimposed on the input voltage of the power-supply negative terminal controlled by the writer.

For the parts that are not detailed or described or recorded in the above embodiment, related descriptions in other embodiments may be referred to.

It should be understood that, values of serial numbers of the steps in the above embodiments don't mean the execution sequence of the steps, the execution sequence of the steps should be determined by its function and internal logics, and should not be construed as limiting the implementation process of the embodiments of the present application.

Example 16

FIG. 12 is a schematic diagram of a data writing device for an integrated circuit chip according to an embodiment of the present disclosure. As shown in FIG. 12, the device 12 of this embodiment includes a processor 120, a memory 121, and computer readable instructions 122 stored in the memory 121 and executable in the processor 120. When the processor 120 executes the computer readable instructions 122 the steps of the data writing method for the integrated circuit chip according to the above embodiments are implemented, such as steps 101' to 103' shown in FIG. 13, or the steps 701' to 703' shown in FIG. 17. Alternatively, when the processor 120 executes the computer readable instructions 122, the functions of the modules/units in the above apparatus embodiments are implemented, such as the functions of the units 101' to 103' shown in FIG. 20, or the functions of the units 111 to 113 shown in FIG. 11.

Illustratively, the computer readable instructions 122 may be divided into one or more modules/units that are stored in the memory 121 and executed by the processor 120, to complete this application. The one or more modules/units may be a series of instruction segments of the computer readable instructions capable of performing a particular function. The instruction segments are used to describe the execution process of the computer readable instructions 122 in the data writing device 12 for the integrated circuit chip.

For example, the computer readable instructions 122 may be divided into a sending unit and a control execution unit (units in a virtual device) and the functions of the respective units are as follows:

The sending unit is configured to send a data writing order to the integrated circuit chip, where the data writing order is configured to instruct the integrated circuit chip to enter a data writing mode after receiving the data writing order.

The control execution unit is configured to perform the data writing to the integrated circuit chip by controlling the electrical parameter of the input voltage of the power-supply negative terminal of the integrated circuit chip after the integrated circuit chip enters the data writing mode.

As another example, the computer readable instructions 122 can be divided into a receiving unit, a detection execution unit, and an enabling unit (units in a virtual device) and the functions of the respective units are as follows.

The receiving unit is configured to receive a data writing order sent from the writer, and to enter a data writing mode.

The detection execution unit is configured to determine the data transmitted from the writer by detecting the electrical parameter of the input voltage of the power-supply negative terminal controlled by the writer.

The enabling unit is configured to enable the data transmitted from the writer.

In the aforesaid embodiments, the description of each of the embodiments is emphasized respectively, regarding a part of one embodiment which isn't described or disclosed in detail, please refer to relevant descriptions in some other embodiments.

The ordinarily skilled one in the art may aware that, the elements and algorithm steps of each of the examples described in connection with the embodiments disclosed herein can be implemented in electronic hardware, or in combination with computer software and electronic hardware. Whether these functions are implemented by hardware or software depends on the specific application and design constraints of the technical solution. The skilled people could use different methods to implement the described functions for each particular application, however, such implementations should not be considered as going beyond the scope of the present disclosure.

It should be understood that, in the embodiments of the present application, the disclosed device/terminal device and method could be implemented in other ways. For example, the device described above are merely illustrative; for example, the division of the units is only a logical function division, and other division could be used in the actual implementation, for example, multiple units or components could be combined or integrated into another system, or some features can be ignored, or not performed. In another aspect, the coupling or direct coupling or communicating connection shown or discussed could be an indirect, or a communicating connection through some interfaces, devices or units, which could be electrical, mechanical, or otherwise.

The units described as separate components could or could not be physically separate, the components shown as units could or could not be physical units, which can be located in one place, or can be distributed to multiple network elements. Parts or all of the elements could be selected according to the actual needs to achieve the object of the present embodiment.

If the integrated unit is achieved in the form of software functional units, and is sold or used as an independent product, it can be stored in a computer readable storage medium. Based on this understanding, a whole or part of flow process of implementing the method in the aforesaid embodiments of the present application can also be accomplished by using computer-readable instructions to instruct relevant hardware. When the computer-readable instructions is executed by the processor, the steps in the various method embodiments described above can be implemented. Where, the computer-readable instructions include computer-readable instruction codes, which can be in the form of source code, object code, executable documents or some intermediate form, etc. The computer readable medium can include: any entity or device that can carry the computer-readable instruction codes, recording medium, USB flash disk, mobile hard disk, hard disk, optical disk, computer storage device, ROM (Read-Only Memory), RAM (Random Access Memory), electrical carrier signal, telecommunication signal and software distribution medium, etc. It needs to be explained that, the contents contained in the computer readable medium can be added or reduced appropriately according to the requirement of legislation and patent practice in a judicial district, for example, in some judicial districts, according to legislation and patent practice, the computer readable medium doesn't include electrical carrier signal and telecommunication signal.

As stated above, the foregoing embodiments are merely used to explain the technical solutions of the present application, and are not intended to limit the technical solutions. Although the present application has been described in detail with reference to the foregoing embodiments, the ordinarily skilled one in the art should understand that the technical solutions described in the foregoing embodiments can still be modified, or equivalent replacement can be made to some of the technical features. Moreover, these modifications or substitutions do not make the essences of corresponding technical solutions depart from the spirit and the scope of the technical solutions of the embodiments of the present application.

What is claimed is:

1. A data writing method for an integrated circuit chip, which is applicable to a writer, wherein the integrated circuit chip has a power-supply positive terminal and a power-supply negative terminal and is configured to be electrically connected with a writer through the power-supply positive terminal and the power-supply negative terminal, the power-supply negative terminal is grounded, and the writer is externally connected with a power source, and the data writing method comprises:
    sending a data writing order to the integrated circuit chip, wherein the data writing order is configured to instruct the integrated circuit chip to enter into a data writing mode upon receiving the data writing order; and
    performing data writing to the integrated circuit chip by controlling an electrical parameter of an input voltage of the power-supply positive terminal or the power-supply negative terminal of the integrated circuit chip when the integrated circuit chip is in the data writing mode.

2. The data writing method according to claim 1, wherein the step of performing data writing to the integrated circuit chip by controlling an electrical parameter of an input voltage of the power-supply positive terminal or the power-supply negative terminal of the integrated circuit chip comprises:
    performing the data writing to the integrated circuit chip by controlling a magnitude of the input voltage of the power-supply positive terminal or the power-supply negative terminal of the integrated circuit chip; or
    performing the data writing to the integrated circuit chip by controlling a frequency of an electrical signal superimposed on the input voltage of the power-supply positive terminal or the power-supply negative terminal of the integrated circuit chip.

3. The data writing method according to claim 2, wherein the step of performing the data writing to the integrated circuit chip by controlling a magnitude of the input voltage of the power-supply positive terminal or the power-supply negative terminal of the integrated circuit chip comprises:
    performing the data writing to the integrated circuit chip by controlling a magnitude of the input voltage of the power-supply positive terminal or the power-supply negative terminal of the integrated circuit chip to be switched between VCC and 0.

4. The data writing method according to claim 1, wherein the step of performing data writing to the integrated circuit chip by controlling an electrical parameter of an input voltage of the power-supply positive terminal or the power-supply negative terminal of the integrated circuit chip comprises:
    performing the current frame data writing to the integrated circuit chip by controlling an electrical parameter of an input voltage of the power-supply positive terminal or the power-supply negative terminal of the integrated circuit chip; and
    the data writing method accordingly further comprises performing next frame data writing when receiving a frame data reception success signal fed back from the integrated circuit chip after the integrated circuit chip successfully receives the current frame data.

5. The data writing method according to claim 1, further comprising:
    controlling an LED electrically connected with the integrated circuit chip to flash; and/or
    controlling a speaker electrically connected with the integrated circuit chip to generate a sound to prompt that the integrated chip successfully enters the data writing mode, after the integrated circuit chip successfully enters the data writing mode.

6. A data writing method for an integrated circuit chip, wherein the integrated circuit chip is configured to be connected with a writer through a power-supply positive terminal and a power-supply negative terminal, and the data writing method comprises:
    receiving, by the integrated circuit chip, a data writing order sent from the writer and entering a data writing mode;
    determining, by the integrated circuit chip, data transmitted from the writer by detecting an electrical parameter of an input voltage of the power-supply positive terminal or the power-supply negative terminal controlled by the writer; and
    enabling, by the integrated circuit chip, the data transmitted from the writer.

7. The data writing method according to claim 6, wherein the step of determining, by the integrated circuit chip, data transmitted from the writer by detecting an electrical parameter of an input voltage of the power-supply positive terminal or the power-supply negative terminal controlled by the writer comprises:
    determining, by the integrated circuit chip, data transmitted from the writer by detecting a magnitude of the input voltage of the power-supply positive terminal or the power-supply negative terminal controlled by the writer; or
    determining, by the integrated circuit chip, data transmitted from the writer by detecting a frequency of an electrical signal superimposed on the input voltage of the power-supply positive terminal or the power-supply negative terminal controlled by the writer.

8. The data writing method according to claim 7, wherein the step of determining, by the integrated circuit chip, data transmitted from the writer by detecting a magnitude of an input voltage of the power-supply positive terminal or the power-supply negative terminal controlled by the writer comprises:

determining, by the integrated circuit chip, binary data transmitted from the writer by detecting whether the magnitude of input voltage of the power-supply positive terminal or the power-supply negative terminal controlled by the writer is VCC or 0.

9. The data writing method according to claim 8, wherein the step of determining, by the integrated circuit chip, data transmitted from the writer by detecting the electrical parameter of the input voltage of the power-supply positive terminal or the power-supply negative terminal controlled by the writer comprises:

feeding back a frame data reception success signal to the writer to instruct the writer to perform next frame data writing to the integrated circuit chip, after it is determined current frame data transmitted from the writer is successfully received.

10. The data writing method according to claim 7, wherein the step of determining, by the integrated circuit chip, data transmitted from the writer by detecting the electrical parameter of the input voltage of the power-supply positive terminal or the power-supply negative terminal controlled by the writer comprises:

feeding back a frame data reception success signal to the writer to instruct the writer to perform next frame data writing to the integrated circuit chip, after it is determined that current frame data transmitted from the writer is successfully received.

11. The data writing method according to claim 6, wherein the step of determining, by the integrated circuit chip, data transmitted from the writer by detecting an electrical parameter of an input voltage of the power-supply positive terminal or the power-supply negative terminal controlled by the writer comprises:

feeding back a frame data reception success signal to the writer to instruct the writer to perform next frame data writing to the integrated circuit chip, after it is determined that current frame data transmitted from the writer is successfully received.

12. A data writing apparatus for an integrated circuit chip for being configured in an integrated circuit chip, wherein the integrated circuit chip has a power-supply positive terminal and a power-supply negative terminal and is configured to be electrically connected with a writer through the power-supply positive terminal and the power-supply negative terminal, the power-supply negative terminal is grounded, and the writer is externally connected with a power source, the data writing apparatus comprises:

a receiving unit configured to receive a data writing order sent from the writer and enter a data writing mode;

a detection execution unit configured to determine data transmitted from the writer by detecting an electrical parameter of an input voltage of the power-supply positive terminal or the power-supply negative terminal controlled by the writer; and an enabling unit configured to enable the data transmitted from the writer.

13. The data writing apparatus according to claim 12, further comprising an LED and a speaker electrically connected with the integrated circuit chip, wherein after the integrated circuit chip successfully enters the data writing mode, the LED is controlled to flash, and the speaker is controlled to generate a sound to prompt that the integrated circuit chip successfully enters the data writing mode.

* * * * *